(12) United States Patent
Nelson et al.

(10) Patent No.: US 12,432,856 B2
(45) Date of Patent: Sep. 30, 2025

(54) SURFACE MOUNT RADIOFREQUENCY COMPONENT

(71) Applicant: KYOCERA AVX Components Corporation, Fountain Inn, SC (US)

(72) Inventors: Cory Nelson, Murrells Inlet, SC (US); Gheorghe Korony, Myrtle Beach, SC (US); Jonathan Herr, Taylors, SC (US); Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 614 days.

(21) Appl. No.: 17/702,927

(22) Filed: Mar. 24, 2022

(65) Prior Publication Data

US 2022/0312593 A1 Sep. 29, 2022

Related U.S. Application Data

(60) Provisional application No. 63/167,202, filed on Mar. 29, 2021.

(51) Int. Cl.
*H05K 1/18* (2006.01)
*H01C 1/012* (2006.01)
*H03H 1/02* (2006.01)

(52) U.S. Cl.
CPC ............ *H05K 1/181* (2013.01); *H01C 1/012* (2013.01); *H03H 1/02* (2013.01)

(58) Field of Classification Search
CPC ........... H05K 1/181; H01C 1/012; H03H 1/02
See application file for complete search history.

(56) References Cited

U.S. PATENT DOCUMENTS

| | | | |
|---|---|---|---|
| 6,657,522 B2 | 12/2003 | Buber et al. | |
| 6,898,070 B2 | 5/2005 | Korony et al. | |
| 7,342,401 B2 | 3/2008 | Knauer | |
| 8,644,029 B1 | 2/2014 | Ji | |
| 9,553,559 B2 | 1/2017 | Sobolewski | |
| 9,870,906 B1 * | 1/2018 | Quarmby | H01J 49/4255 |

(Continued)

FOREIGN PATENT DOCUMENTS

KR 10-1348926 1/2014

OTHER PUBLICATIONS

Andrews Ph.D., "Broadband Coaxial Bias Tees," Picosecond Pulse Labs, Nov. 2000—3 pages.

(Continued)

*Primary Examiner* — Nathan W Ha
(74) *Attorney, Agent, or Firm* — Dority & Manning, P.A.

(57) ABSTRACT

A surface mount component can include a monolithic substrate, an input terminal, an output terminal, and a DC bias terminal. Each terminal can be formed over the monolithic substrate. A conductive trace can be formed over a surface of the monolithic substrate included in a signal path between the input terminal and the output terminal. A thin-film resistor can be connected in a DC bias path between the DC bias terminal and the signal path. The DC bias path can have, at one or more locations along the DC bias path between the DC bias terminal and the signal path, a cross-sectional area in a plane that is perpendicular to the surface of the monolithic substrate. The cross-sectional area of the DC bias path can be less than about 1,000 square microns.

34 Claims, 29 Drawing Sheets

(56) References Cited

U.S. PATENT DOCUMENTS

| | | | | |
|---|---|---|---|---|
| 10,102,962 | B1* | 10/2018 | Cappabianca | H01F 17/06 |
| 10,653,013 | B1* | 5/2020 | Hwang | H01C 1/14 |
| 10,673,110 | B2 | 6/2020 | Korony | |
| 2016/0268050 | A1* | 9/2016 | Hattori | H01C 1/012 |
| 2016/0294349 | A1* | 10/2016 | Morito | H03H 7/0153 |
| 2016/0308505 | A1* | 10/2016 | Korony | H04B 3/04 |
| 2017/0278638 | A1* | 9/2017 | Hattori | H01C 1/012 |
| 2018/0045903 | A1* | 2/2018 | Nakagawa | G02B 6/4243 |
| 2019/0044212 | A1* | 2/2019 | Korony | H03H 1/02 |
| 2020/0007105 | A1* | 1/2020 | Song | H01L 23/5222 |
| 2020/0313049 | A1* | 10/2020 | Huang | H01L 33/60 |
| 2021/0225562 | A1* | 7/2021 | Matsubara | H01C 7/003 |
| 2021/0257147 | A1* | 8/2021 | Misawa | H01F 1/24 |

OTHER PUBLICATIONS

International Search Report and Written Opinion for PCT/US2022/022149 dated Mar. 28, 2022, 11 pages.

* cited by examiner

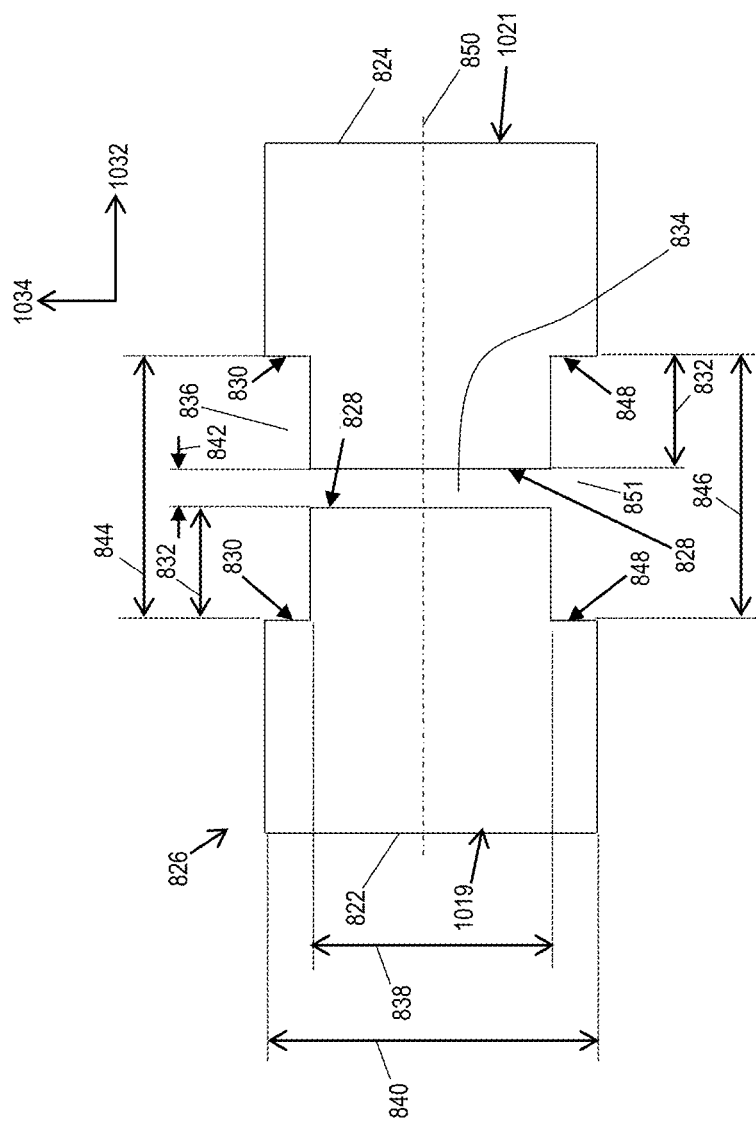

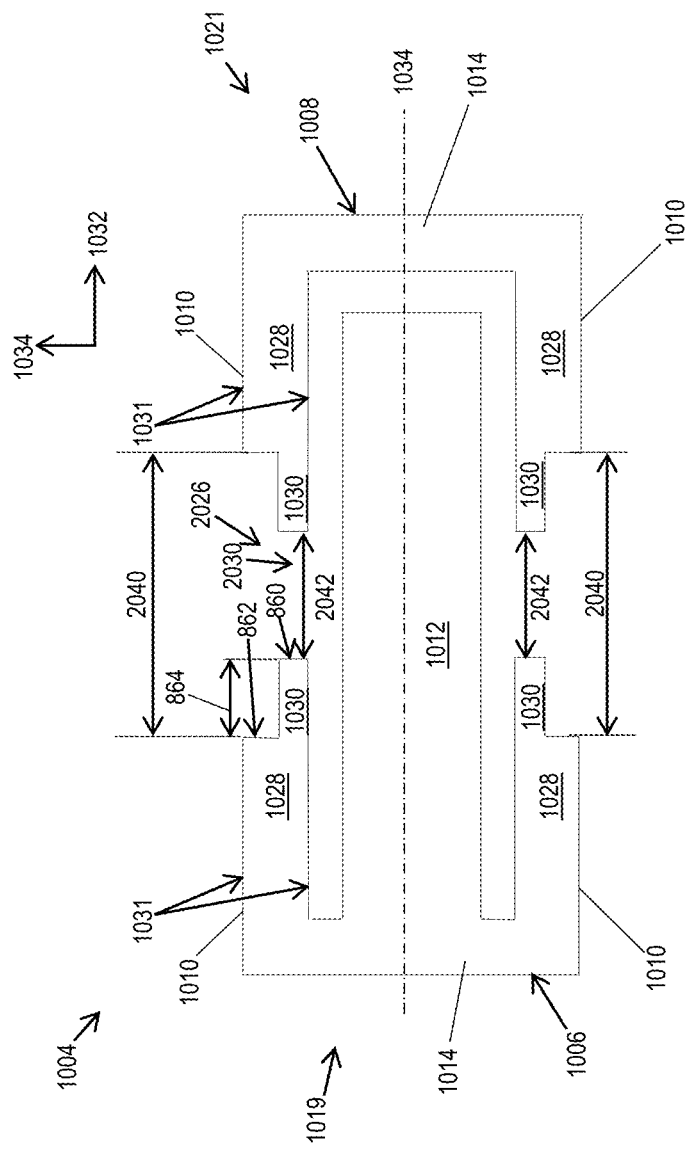

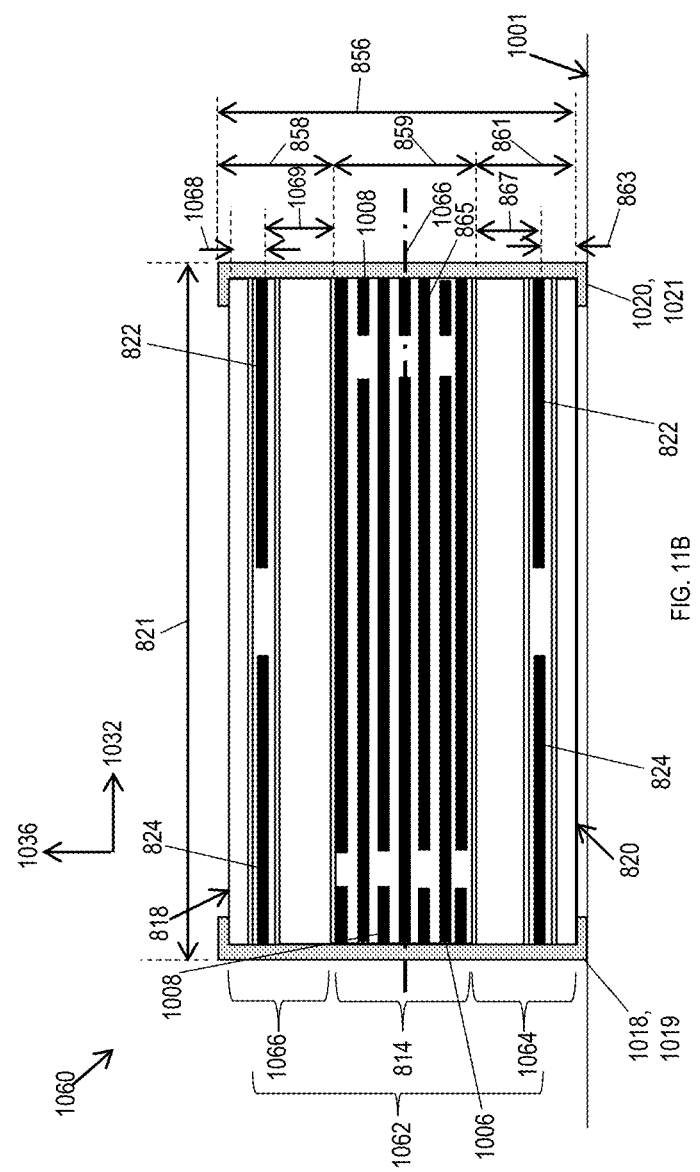

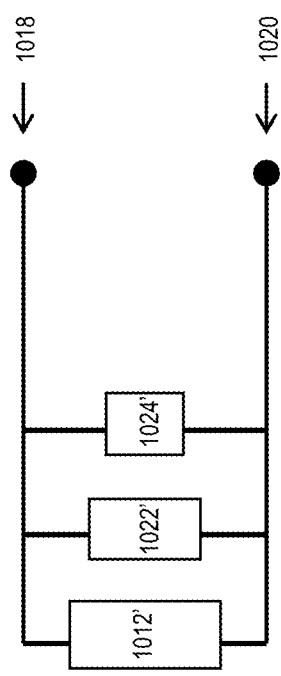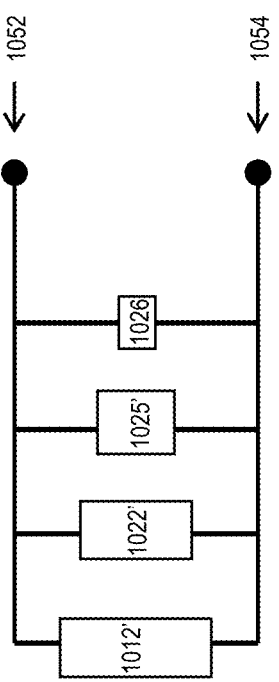

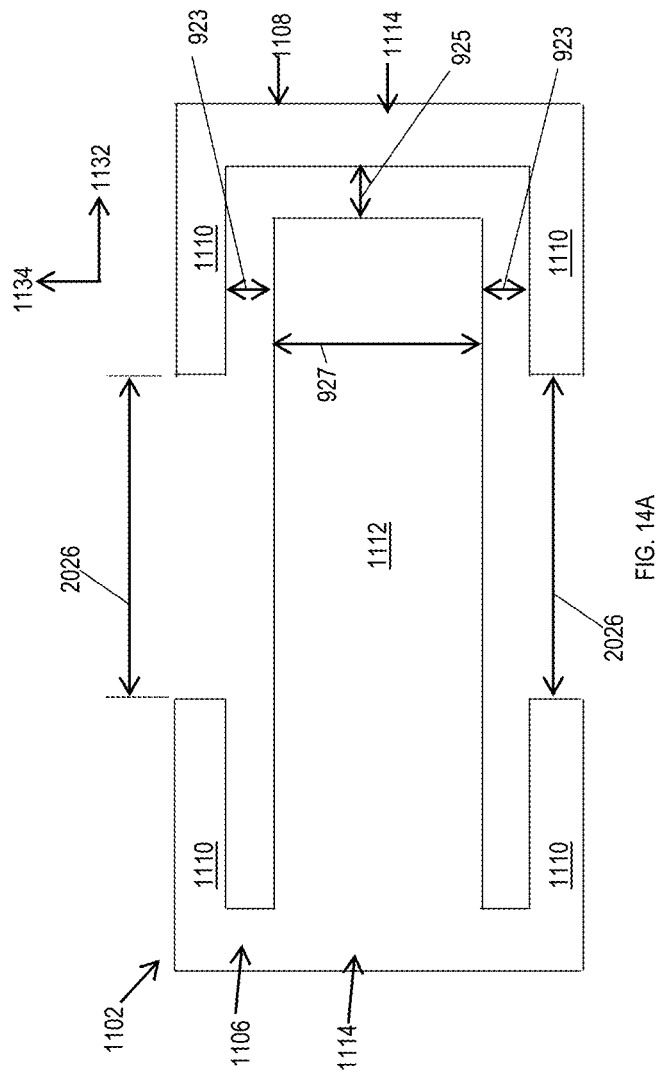

SURFACE MOUNT RADIOFREQUENCY COMPONENT

CROSS REFERENCE TO RELATED APPLICATION

The present application claims filing benefit of U.S. Provisional Patent Application Ser. No. 63/167,202 having a filing date of Mar. 29, 2021, which is incorporated herein by reference in its entirety.

FIELD OF THE INVENTION

The present subject matter generally concerns surface mount components. More particularly, the present subject matter relates to a surface mount surface mount component for adjusting (e.g., removing and/or adding) a direct current (DC) component to a signal.

BACKGROUND OF THE INVENTION

High frequency radio signal communication has increased in popularity. A trend towards miniaturization has also increased the desirability of small, passive components. Miniaturization has also increased the difficulty of surface mounting small, passive components.

Bias tees are configured to remove and/or add a direct current (DC) component to a signal passed through the bias tee. However, conventional bias tee components are generally large, such as having a high profile (e.g., thickness) and a large footprint. Conventional bias tees can often include wire wound inductors that can increase the size of the component.

SUMMARY

In accordance with one embodiment of the present invention, a surface mount component can include a monolithic substrate, an input terminal, an output terminal, and a DC bias terminal. Each terminal can be formed over the monolithic substrate. A conductive trace can be formed over a surface of the monolithic substrate included in a signal path between the input terminal and the output terminal. A thin-film resistor can be connected in a DC bias path between the DC bias terminal and the signal path. The DC bias path can have, at one or more locations along the DC bias path between the DC bias terminal and the signal path, a cross-sectional area in a plane that is perpendicular to the surface of the monolithic substrate. The cross-sectional area of the DC bias path can be less than about 1,000 square microns.

In accordance with another embodiment of the present invention, a surface mount component can include a monolithic substrate, an input terminal, an output terminal, and a DC bias terminal. Each terminal can be formed over the monolithic substrate. A conductive trace can be formed over a surface of the monolithic substrate included in a signal path between the input terminal and the output terminal. A thin-film resistor can be connected in a DC bias path between the DC bias terminal and the signal path. The DC bias path can have, at one or more locations along the DC bias path between the DC bias terminal and the signal path, a width in a XY plane that is parallel with the surface of the monolithic substrate that is less than about 100 microns.

In accordance with another embodiment of the present invention, a method of forming a surface mount component can include patterning a conductive trace over a surface of the monolithic substrate included in a signal path between the input terminal and the output terminal; depositing a thin-film resistor connected in a DC bias path between the DC bias terminal and the signal path; and forming an input terminal, an output terminal, and a DC bias terminal over a monolithic substrate. The DC bias path can have, at one or more locations along the DC bias path between the DC bias terminal and the signal path, a cross-sectional area in a plane that is perpendicular to the surface of the monolithic substrate, and wherein the cross-sectional area of the DC bias path is less than about 1,000 square microns.

BRIEF DESCRIPTION OF THE DRAWINGS

A full and enabling disclosure of the present invention, including the best mode thereof, directed to one of ordinary skill in the art, is set forth in the specification, which makes reference to the appended Figures, in which:

FIG. 9D illustrates a top down view of the embodiment of a shield electrode layer in which multiple capacitive regions are formed according to aspects of the present disclosure;

FIG. 10A illustrates a top view of another embodiment of an active electrode layer according to aspects of the present disclosure;

FIG. 11B illustrates another embodiment of a capacitor according to aspects of the present disclosure;

FIG. 12 depicts a circuit schematic representation of the embodiment of a capacitor illustrated in FIGS. 9A through 9E with multiple capacitive regions;

FIG. 13 depicts a circuit schematic representation of the embodiment of a capacitor illustrated in FIGS. 10A through 10C with multiple capacitive regions;

FIG. 14A illustrates a top view of one embodiment of an active electrode layer of a capacitor according to aspects of the present disclosure;

Figure 1A:
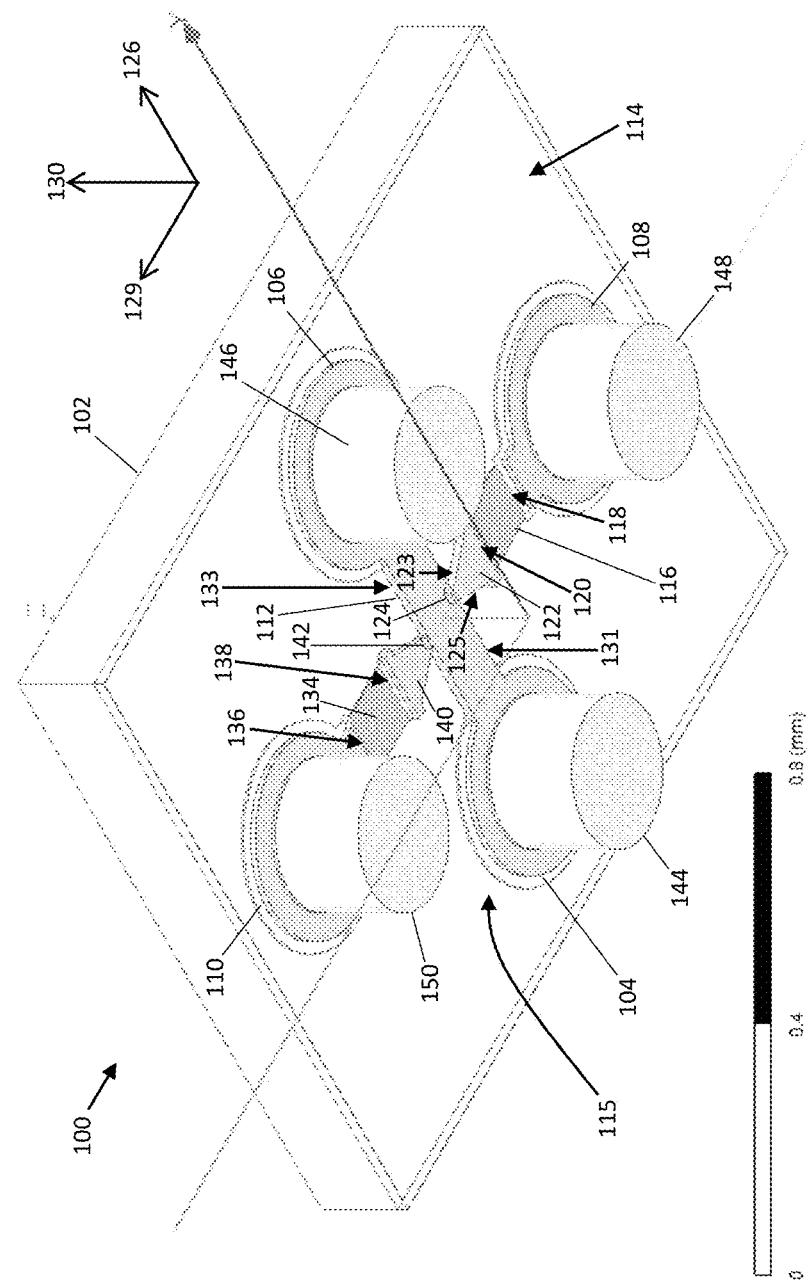
FIG. 1A is a perspective view of one embodiment of a surface mount component according to aspects of the present disclosure.

Repeat use of reference characters throughout the present specification and appended drawings is intended to represent same or analogous features or elements of the invention.

DETAILED DESCRIPTION OF REPRESENTATIVE EMBODIMENTS

A surface mount component is disclosed that can adjust (e.g., remove and/or add) a DC bias voltage to an AC signal. The surface mount component can employ one or more thin-film resistors and/or narrow current flow constrictions. Such features can reduce AC perturbations when adding a DC bias component to a signal. Thin-film resistors and narrow current flow constrictions can generally be provided in very small areas (e.g., footprints) such that the resulting surface mount component can be achieved in a small footprint (e.g., on a printed circuit board or the like). Further, in some embodiments, the surface mount component can include a DC blocking capacitor such that the surface mount component can both block (e.g., remove) a DC component of an input signal and add a new DC component to an output signal received from the surface mount component. Thus, the current surface mount component can provide a compact solution for adjusting a DC bias component of a signal.

For example, the surface mount component may have a compact size, e.g., footprint. The surface mount component can have a footprint that is less than about 15 mm$^2$, in some embodiments less than about 10 mm$^2$, in some embodiments less than about 5 mm$^2$, in some embodiments less than about 3 mm$^2$, and in some embodiments less than about 2 mm$^2$.

The surface mount component may have an overall length from about 1 mm to about 3.5 mm, in some embodiments, from about 1 mm to about 3 mm, and in some embodiments from about 1.2 mm to about 2 mm.

The surface mount component may have an overall width from about 0.8 mm to about 3.5 mm, in some embodiments, from about 0.9 mm to about 3 mm, and in some embodiments from about 1 mm to about 2 mm.

The surface mount component may have an overall thickness from about 0.1 mm to about 2 mm, in some embodiments from about 0.2 mm to about 1.5 mm, in some embodiments from about 0.3 mm to about 1 mm, and in some embodiments from about 0.4 mm to about 0.8 mm.

The surface mount component can include a monolithic substrate and multiple terminals formed on a surface of the monolithic substrate. The surface mount component can include an input terminal (e.g., a first terminal), a second n output terminal (e.g., a second terminal), and a DC bias terminal (e.g., a third terminal). In some embodiments, the surface mount component can include an additional DC bias terminal (e.g., a fourth terminal) can be formed over the monolithic substrate. A conductive trace can be formed over a surface of the monolithic substrate included in a signal path between the input terminal and the output terminal.

At one or more locations along the DC bias path between the DC bias terminal and the signal path, the DC bias path can have a cross-sectional area that is less than 1,000 square microns and/or have a width that is less than 100 microns. The cross-sectional area can be in a plane that is perpendicular to the surface of the monolithic substrate. The width can be a plane that is parallel with the surface of the monolithic substrate. For example, in some embodiments, this cross-sectional area and/or width can be located where a conductive thin-film connector connects with the conductive trace. The DC bias path can be wider and/or have a larger cross-sectional area at other locations along the DC bias path. However, in other embodiments the DC bias path can generally have the cross-sectional area that is less than 1,000 square microns and/or have the width that is less than 100 microns along some, most, or all of the DC bias path.

In an example embodiment, a first resistor can have a first end connected with the DC bias terminal and a second end connected with the conductive trace by a first conductive thin-film connector having the cross-sectional area that is less than 1,000 square microns and/or have the width that is less than 100 microns.

The first resistor and/or the relatively small cross-sectional area and/or width of the DC bias path (e.g., the first conductive thin-film connector) can be configured to reduce and/or prohibit alternating current (AC) perturbances from being introduced to the signal path from the DC bias terminal.

At one or more locations along the first conductive thin-film connector, the first conductive thin-film connector can have the relatively small cross-sectional area. The relatively small cross-sectional area can reduce and/or prohibit the AC perturbances from passing therethrough. For example, the cross-sectional area can be in a plane that is perpendicular to the surface of the monolithic substrate.

As one example, the cross-sectional area can be located where the first conductive thin-film connector connects with the conductive trace (e.g., at an edge of the conductive trace). The conductive trace can be elongated in a Y-direction. The first conductive thin-film connector can have a thickness in the Z-direction that is perpendicular to the Y-direction. The first conductive thin-film connector can have a width in an XY plane (e.g., in the Y-direction) at one or more locations. For example, the conductive trace can have a first edge and a second edge opposite the first edge. Each of the first edge and the second edge can extend in the Y-direction. The edges can be straight and parallel with each other. The first conductive thin-film connector can have a width of the first conductive thin-film connector can be located where the first conductive thin-film connector connects with the first edge of the conductive trace.

However, the narrow cross-sectional area can be located at any suitable location along the DC bias path between the DC bias terminal and the conductive trace. As examples, the thin-film resistor and/or DC bias terminal may have one or more locations defining small cross-sectional areas and/or widths.

In some embodiments, a second resistor (e.g., an additional resistor) can have a first end connected with the additional DC bias terminal and a second end connected with the signal path, e.g., by a second conductive thin-film connector connecting the second resistor to the conductive trace. The second conductive thin-film connector can have a similar configuration as the first conductive thin-film connector. For example, second conductive thin-film connector can have a cross-sectional area less than about 1,000 square microns and/or a width less than about 100 microns.

An input signal can be applied to the input terminal (e.g., first terminal) and an output signal can be produced at the output terminal (e.g., second terminal). A direct current (DC) bias voltage can be applied to the DC bias terminal and/or additional DC bias terminal with respect to the input terminal. The first conductive thin-film connector and/or the second conductive thin-film connector can reduce and/or limit AC perturbations introduced to the signal path and thereby introduced to the output signal produced at the output terminal. For example, the respective narrow or constricted points of the first conductive thin-film connector and the second conductive thin-film connector can reduce or prohibit the transmission of alternating current from the DC bias terminal and/or additional DC bias terminal to the conductive trace.

The surface mount component can be configured for grid array type mounting, such as land grid array, ball grid array, etc. For example, each of the terminals may be formed on the surface of the surface mount component. Each terminal can include respective solder balls for ball grid array type mounting. However, any suitable variety of external terminals can be provided for surface mounting the surface mount component. One or more terminals of the surface mount component can be formed on one or more side surfaces of a substrate of the surface mount component. For instance, the first external terminal and the second external terminal can wrap around the side surfaces. The third external terminal and/or fourth external terminal can be formed on side surfaces of the substrate and configured as castellations or the like.

In some embodiments, the conductive trace can be directly electrically connected with each of the input terminal and the second terminal. The conductive trace can be free of capacitors or other elements that would interrupt a direct current flow between the input terminal and the second terminal. However, in other embodiments, the surface mount component can include one or more capacitors. In some embodiments, the surface mount component can be configured to reduce and/or remove a DC component of an input signal applied to the input terminal. For example, the surface mount component can include a capacitor. The capacitor can connect with the conductive trace in the signal path between the input terminal and the second terminal. For example, the first conductive thin-film connector can connect with the conductive trace at a first location along the conductive trace that is between the capacitor and the input terminal. The capacitor can block a DC component of the input signal from the input terminal to the second terminal while permitting an AC component of the input signal to pass through the capacitor to the second terminal. Thus, the surface mount component can both block a DC component of the input signal from the input terminal while introducing a DC bias voltage to be introduced into the output signal from the DC bias terminal and/or the additional DC bias terminal (e.g., by the third terminal and/or the fourth terminal).

In some embodiments, the first conductive thin-film connector can generally be aligned with the second conductive thin-film connector in the Y-direction. For example, the conductive trace can be elongated in the Y-direction. The first conductive thin-film connector can connect with the conductive trace at the first location along the conductive trace. The second conductive thin-film connector can connect with the conductive trace at a second location. The second location can be generally aligned with the first location in the Y-direction. For example, the first location can be spaced apart from the second location by less than a distance of about 10 microns in the Y-direction. Thus, the first conductive thin-film connector can generally be aligned with the second conductive thin-film connector in the Y-direction.

The monolithic substrate can be or include a variety of suitable materials. For example, monolithic substrate can be or include a variety of ceramic materials, such as aluminum oxide (alumina), aluminum nitride, beryllium oxide, boron nitride, silicon nitride, magnesium oxide, zinc oxide, silicon carbide, any suitable ceramic material, and mixtures thereof. The monolithic substrate can be or include silicon (Si), glass, and glass-ceramic materials.

The thin film components (e.g., the thin-film resistor(s), conductive trace, terminals, and/or the conductive thin-film connector(s)) may be precisely formed using a variety of suitable subtractive, semi-additive, or fully additive processes. For example, physical vapor deposition and/or chemical deposition may be used. For instance, in some embodiments, the thin film components may be formed using sputtering, a type of physical vapor deposition. A variety of other suitable processes may be used, however, including plasma-enhanced chemical vapor deposition (PECVD), electroless plating, and electroplating, for example. Lithography masks and etching may be used to produce the desired shape of the thin film components. A variety of suitable etching techniques may be used including dry etching using a plasma of a reactive or non-reactive gas (e.g., argon, nitrogen, oxygen, chlorine, boron trichloride) and/or wet etching.

The resistive layer may be formed using a variety of thin film techniques, including photolithography or any other suitable patterning technique, etching, PECVD (Plasma Enhanced Chemical Vapor Deposition) processing, or other additive and/or subtractive techniques. The resistive layer may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials.

The resistive layer may have any suitable thickness. For example, in some embodiments a thickness of the resistive layer may range from about 0.01 µm to about 100 µm, in some embodiments from about 0.1 µm to about 50 µm, in some embodiments from about 0.5 µm to about 20 µm.

The conductive trace may be formed from a variety of suitable conductive materials. For example, the conductive trace may include aluminum, copper, gold, silver, nickel, mixtures thereof, and/or any other suitable metals, metal-filled polymeric materials, or any other suitable conductive materials.

The conductive trace may have any suitable thickness. For example, in some embodiments a thickness of the conductive trace may range from about 0.001 µm to about 1,000 µm, in some embodiments from about 0.01 µm to about 100 µm, in some embodiments from about 0.1 µm to about 50 µm, in some embodiments from about 0.5 µm to about 20 µm.

As used herein, "formed over" may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

Aspects of the present disclosure are directed to a surface mount assembly including the surface mount component and a multi-layer ceramic capacitor, for example as described below with reference to FIGS. 4A and 4B.

The multilayer ceramic capacitor exhibits excellent insertion loss characteristics in a first orientation relative to a mounting surface. For example, the capacitor may exhibit an insertion loss that is greater than about −0.5 dB from about 1 GHz to about 40 GHz, in some embodiments greater than about −0.4 dB, in some embodiments greater than about −0.35 dB, and in some embodiments greater than about −0.3 dB. In some embodiments the capacitor may exhibit an insertion loss that is greater than about −0.4 dB at about 10 GHz, in some embodiments greater than about −0.35 dB at about 10 GHz, in some embodiments greater than about −0.3 dB, and in some embodiments greater than about −0.25 dB at about 10 GHz. The capacitor may exhibit an insertion loss that is greater than about −0.4 dB at about 20 GHz, in some embodiments greater than about −0.35 dB at about 20 GHz, and in some embodiments greater than about −0.3 dB at about 20 GHz. The capacitor may exhibit an insertion loss that is greater than about −0.4 dB at about 30 GHz, in some embodiments greater than about −0.35 dB at about 30 GHz, in some embodiments greater than about −0.3 dB at about 30 GHz, and in some embodiments greater than about −0.25 dB at about 30 GHz. The capacitor may exhibit an insertion loss that is greater than about −0.4 dB at about 40 GHz, in some embodiments greater than about −0.35 dB at about 40 GHz, in some embodiments greater than about −0.3 dB at about 40 GHz, and in some embodiments greater than about −0.25 dB at about 40 GHz.

In some embodiments, the broadband multilayer ceramic capacitor may exhibit an insertion loss that ranges from about −0.05 dB to about −0.4 dB from about 5 GHz to about 20 GHz, in some embodiments from about −0.05 dB to about −0.3 dB from about 10 GHz to about 20 GHz, in some embodiments from about −0.05 dB to about −0.3 dB from about 20 GHz to about 30 GHz, and in some embodiments from about −0.05 dB to about −0.3 dB from about 30 GHz to about 40 GHz.

I. Example Embodiments

FIG. 1A illustrates a surface mount component 100 including a monolithic substrate 102. An input terminal 104, an output terminal 106, a DC bias terminal 108, and an additional DC bias terminal 110 can connect with (e.g., be formed over) the monolithic substrate 102. A conductive trace 112 can be formed over a surface 114 of the monolithic substrate 102 included in a signal path 115 between the input terminal 104 and the second terminal 106.

A first resistor 116 can have a first end 118 connected with the DC bias terminal 108 and a second end 120 connected with the signal path 115 via the conductive trace 112. In the depicted embodiment, a first conductive thin-film connector 122 having a narrow point 124 extends between the first resistor 116 and the conductive trace 112 to connect the first resistor 116 with the conductive trace 112 and, thereby, the signal path 115. The first resistor 116 and/or the first conductive thin-film connector 122 can be configured to reduce and/or prohibit AC perturbances from being introduced to the conductive trace 112 from the DC bias terminal 108.

The narrow point 124 of the first conductive thin-film connector 122 can have a relatively small cross-sectional area that can function to reduce and/or prohibit the AC perturbances from passing therethrough. For example, narrow point 124 can have a cross-sectional area in a plane that is perpendicular to the surface 114 of the monolithic substrate 102 and a width in a plane that is parallel to the surface 114 of the monolithic substrate. For example, the cross-sectional area can be defined in a YZ plane that is aligned with the Z-direction 130 and the Y-direction 126. The surface 114 can lie in an XY plane that includes the Y-direction 126 and an X-direction 129 that is perpendicular to each of the Y-direction 126 and the Z-direction 130. The width can be defined in an XY plane parallel to the surface 114.

Figure 1B:
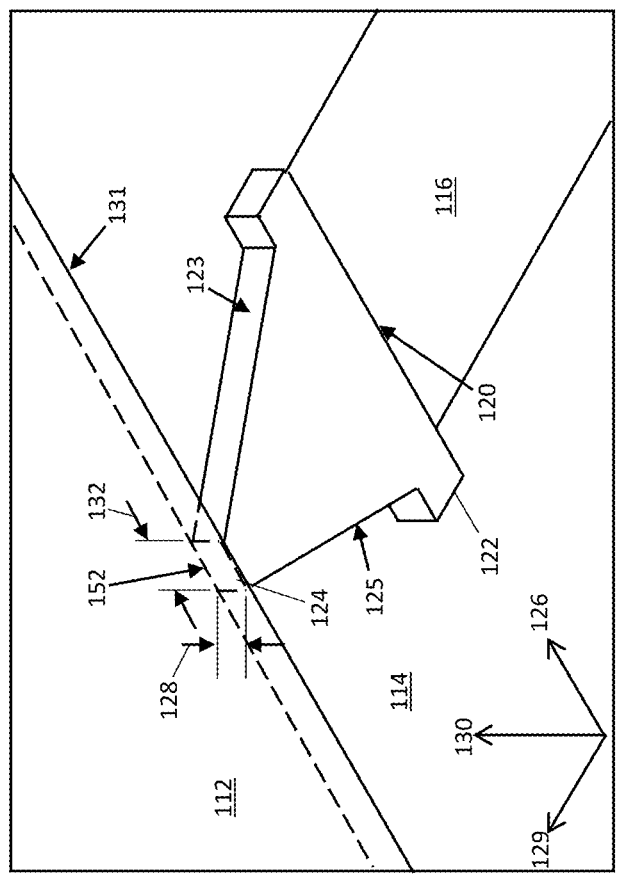
FIG. 1B illustrates a partial, enlarged perspective view of a portion of the surface mount component of FIG. 1A.

FIG. 1B illustrates a partial, enlarged perspective view of a portion of the surface mount component 100 of FIG. 1A. The conductive trace 112 can be elongated in a Y-direction 126. The first conductive thin-film connector 122 can have a thickness 128 in the Z-direction 130 that is perpendicular to the Y-direction 126. The first conductive thin-film connector 122 can have a width 132 in the Y-direction 126 at the narrow point 124 of the first conductive thin-film connector 122. For example, the conductive trace 112 can have a first edge 131 and a second edge 133 (FIG. 1A) opposite the first edge 131. Each of the first edge 131 and the second edge 133 can extend in the Y-direction 126. For example, the first and second edges 131, 133 can be straight and parallel with each other. The narrow point 124 of the first conductive thin-film connector 122 can be located where the first conductive thin-film connector 122 can connect with the first edge 131 of the conductive trace 112.

Referring again to FIG. 1A, in some embodiments, a second resistor 134 can have a first end 136 connected with the additional DC bias terminal 110 and a second end 138 connected with the signal path via the conductive trace 112. More particularly, a second conductive thin-film connector 140 extends between the second resistor 134 and the conductive trace 112 to connect the second resistor 134 with the signal path. The second conductive thin-film connector 140 can have a similar configuration as the first conductive thin-film connector 122. For example, second conductive thin-film connector 140 can have a narrow point 142. The narrow point 142 can have a cross-sectional area in the YZ plane that is perpendicular to the surface 114.

The first conductive thin-film connector 122 and second conductive thin-film connector 140 can have a variety of shapes within the scope of this disclosure. For example, the first conductive thin-film connector 122 can have a pair of substantially straight edges 123, 125 that converge at the first location 152. However, in other embodiments, the edges 123, 125 can be curved and/or can include a plurality of stair steps that converge at the first location 152. The conductive thin-film connectors 122, 140 can have any suitable shape that includes respective narrow points 124, 142.

An input signal can be applied to the input terminal 104 and an output signal can be produced at the output terminal 106. A DC bias voltage can be applied to the DC bias terminal 108 and/or additional DC bias terminal 110 with respect to the input terminal 104. The first conductive thin-film connector 122 and the second conductive thin-film connector 140 can reduce and/or limit AC perturbances introduced to the conductive trace 112 and thereby introduced to the output signal produced at the second or output terminal 106. For example, the respective narrow points 124, 142 of the first conductive thin-film connector 122 and the second conductive thin-film connector 140 can reduce or prohibit the transmission of AC from the DC bias terminal 108 and/or the additional DC bias terminal 110 to the conductive trace 112.

In some embodiments, the conductive trace 112 can be directly connected with each of the input terminal 104 and the output terminal 106. For example, the conductive trace 112 can be free of capacitors or other elements that would interrupt a direct current flow between the input terminal 103 and the second terminal 106. However, in other embodiments, the surface mount component 100 can include one or more capacitors, for example as described below with reference to FIGS. 10 and 3.

The surface mount component 100 can be configured for grid array type mounting, such as land grid array, ball grid array, etc. For example, each of the terminals 104, 106, 108, 110 may be formed on the surface 114 of the surface mount component 100. Each terminal 104, 106, 108, 110 can include respective solder balls 144, 146, 148, 150 for ball grid array type mounting. However, any suitable variety of external terminals can be provided for surface mounting the surface mount component 100. For example, referring to FIGS. 2A and 2B, a surface mount component 200 can include first, second, third, and fourth external terminals 204, 206, 208, 210 formed on one or more side surfaces 201 of a monolithic substrate 202 of the surface mount component 200. For instance, the first external terminal 204 and second external terminal 206 (e.g., the input terminal 204 and the output terminal 206) can wrap around the side surfaces 201. The third external terminal 208 and/or fourth external terminal 210 (e.g., the DC bias terminal 208 and the additional DC bias terminal 210) can be formed on side surfaces 201 of the monolithic substrate 202 and configured as castellations or the like.

Figure 1C:
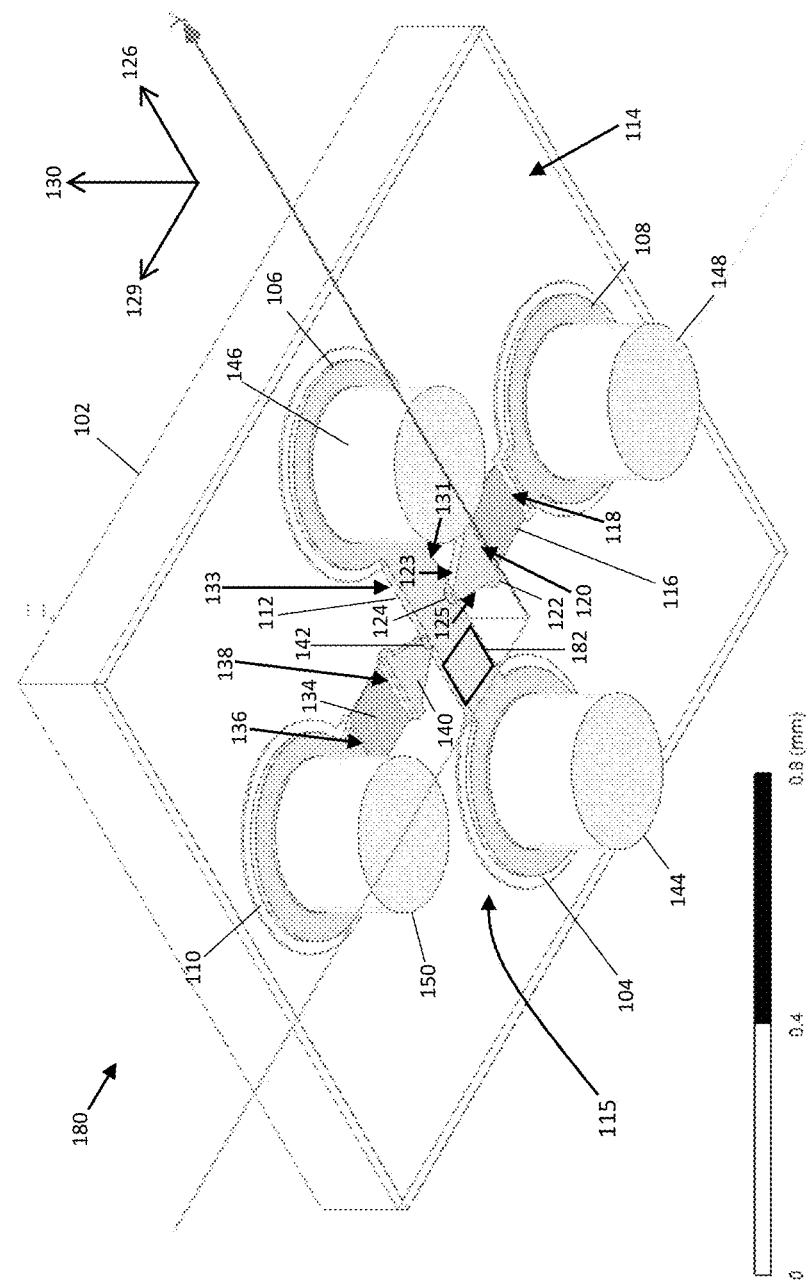
FIG. 1C illustrates an embodiment of the surface mount component including a DC blocking capacitor according to aspects of the present disclosure.

FIG. 1C illustrates another embodiment of surface mount component 180 according to aspects of the present disclosure. The same reference numerals are used in FIG. 1C as FIGS. 1A and 1B to reflect the same features and components. The surface mount component 180 can include a capacitor 182 connected with the conductive trace 112 in the signal path between the input terminal 104 and the second terminal 106. For example, the first conductive thin-film connector 122 can connect with the conductive trace 112 at a location along the conductive trace 112 that is between the capacitor 182 and the input terminal 104.

The capacitor 182 can block a DC component of the input signal from the input terminal 104 to the second terminal 106 while permitting an AC component of the input signal to pass through the capacitor 182 to the second terminal 106. Thus, the surface mount component 180 can both block a DC component of the input signal from the input terminal 104 while permitting a DC bias voltage to be introduced at the output signal to the DC bias terminal 108 and/or the additional DC bias terminal 110.

Figure 1D:
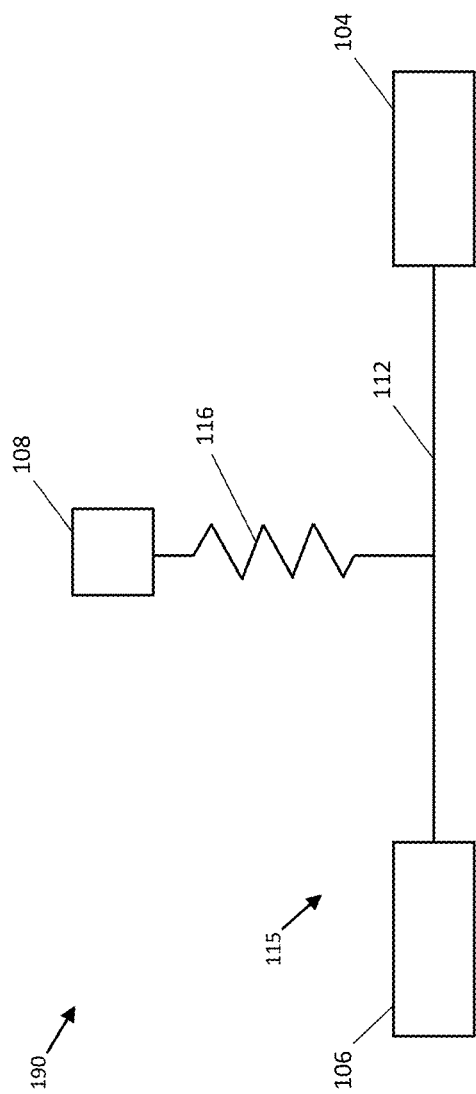
FIG. 1D schematically illustrates an embodiment of the surface mount component including three terminals rather than four terminals according to aspects of the present disclosure.

FIG. 1D schematically illustrates another embodiment of a surface mount component according to aspects of the present disclosure. The same reference numerals are used in FIG. 1D as FIGS. 1A through 1C to reflect the same features and components. The surface mount component 190 illustrated in FIG. 1D can be a three terminal device, rather than a four terminal device as shown in FIGS. 1A through 1C. For example, the surface mount component 190 includes a resistor 116 extending between the DC bias terminal 108 and the signal path. In the embodiment of FIG. 1D, the resistor 116 extends between the DC bias terminal 108 and the conductive trace 112, but the resistor 116 could directly connect with the input terminal 104 or the output terminal 106 as described in greater detail, e.g., with respect to the embodiment illustrated in FIG. 5. The surface mount component 190 does not include the additional DC bias terminal 110 nor a second resistor such as resistor 134.

Figure 2A:
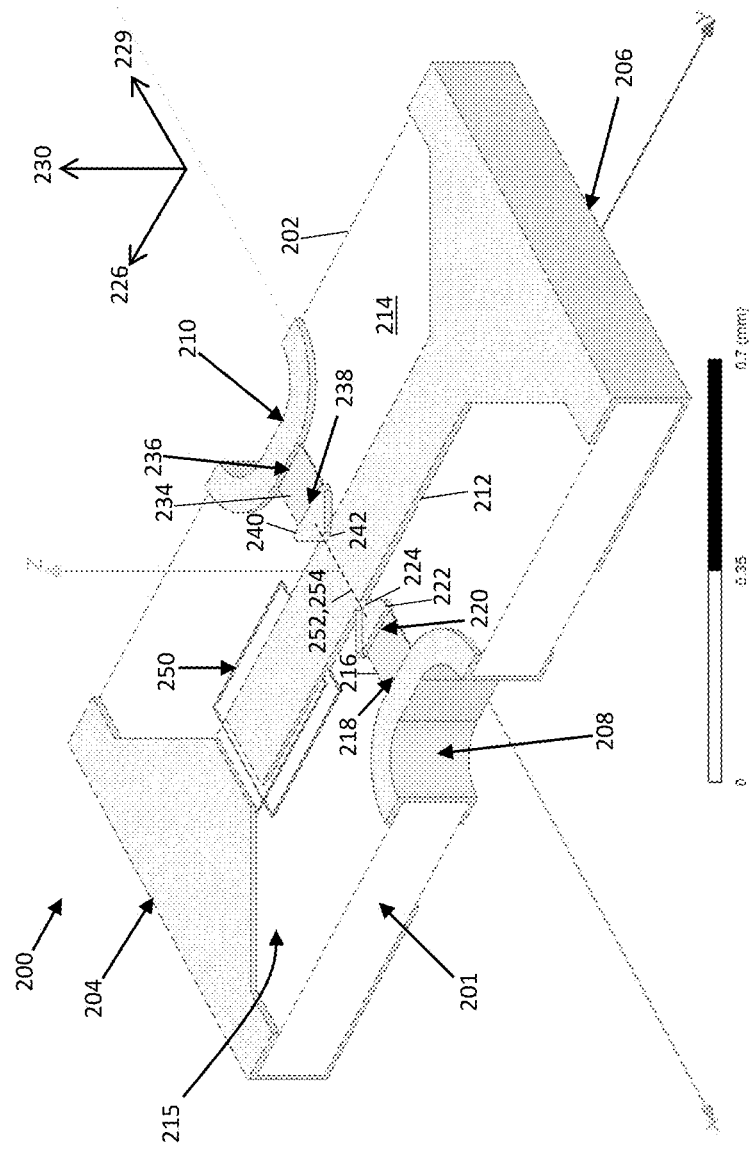
FIG. 2A illustrates another embodiment of a surface mount component according to aspects of the present disclosure.
Figure 2B:
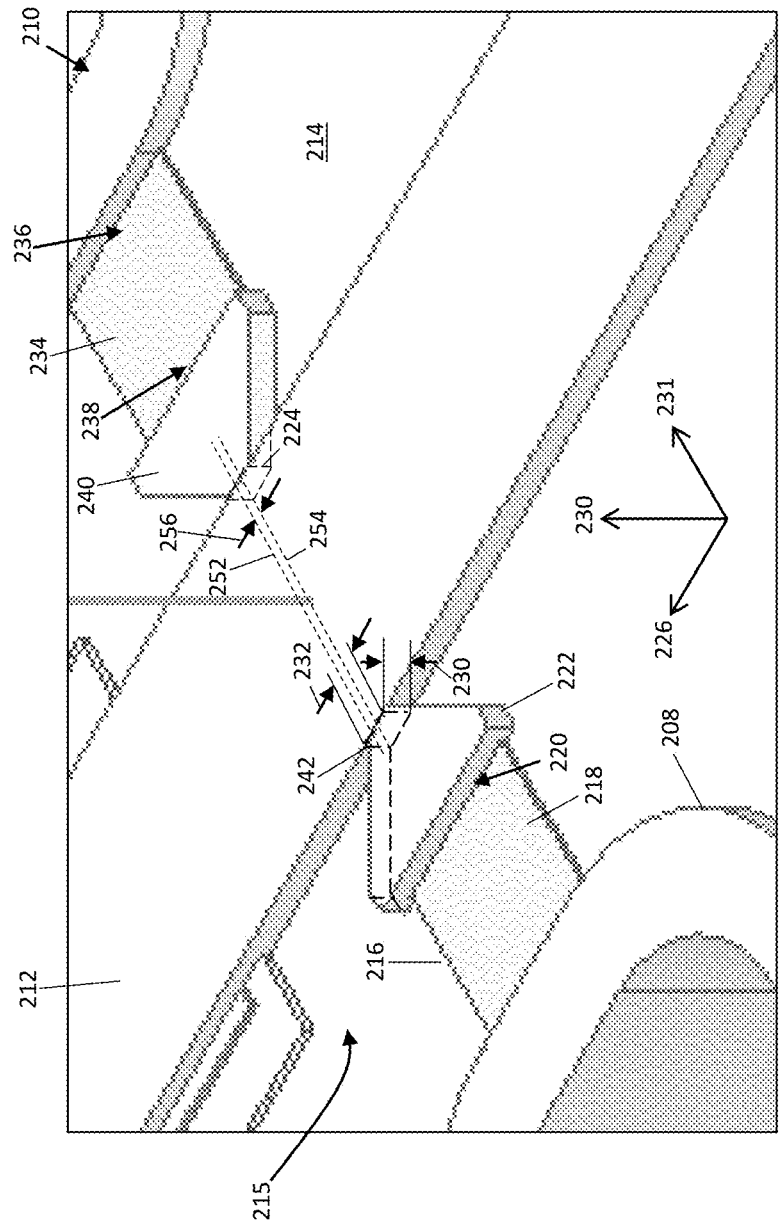
FIG. 2B illustrates a partial, enlarged perspective view of a portion of the surface mount component of FIG. 2A.

FIGS. 2A and 2B illustrate another embodiment of a surface mount component 200 according to aspects of the present disclosure. Reference numerals are used in FIGS. 2A and 2B for the surface mount component 200 that are similar to the reference numerals used in FIGS. 1A and 1B. For example, the surface mount component 100 of FIGS. 1A and 1B includes a conductive trace 112, and the surface mount component 200 of FIGS. 2A and 2B can include a conductive trace 212.

The surface mount component 200 can include a capacitor 250. The capacitor 250 can connect with the conductive trace 212 in the signal path 215 between the input terminal 204 and the second terminal 206. For example, the first conductive thin-film connector 222 can connect with the conductive trace 212 at a first location 252 along the conductive trace 212 that is between the capacitor 250 and the input terminal 204.

The capacitor 250 can block a DC component of the input signal from the input terminal 204 to the second terminal 206 while permitting an AC component of the input signal to pass through the capacitor 250 to the second terminal 206. Thus, the surface mount component 200 can both block a DC component of the input signal from the input terminal 204 while permitting a DC bias voltage to be introduced at the output signal to the DC bias terminal 208 and/or the additional DC bias terminal 210.

In some embodiments, the first conductive thin-film connector 222 can generally be aligned with the second conductive thin-film connector 240 in the Y-direction 226. For example, the conductive trace 212 can be elongated in the Y-direction 226. The first conductive thin-film connector 222 can connect with the conductive trace 212 at the first location 252 along the conductive trace 212. The second conductive thin-film connector 240 can connect with the conductive trace 212 at a second location 254. The second location 254 can be generally aligned with the first location 252 in the Y-direction 226. For example, the first location 252 can be spaced apart from the second location 254 by less than a distance 256 of about 10 microns in the Y-direction 226. Thus, the first conductive thin-film connector 222 can generally be aligned with the second conductive thin-film connector 240 in the Y-direction 226.

Figure 3:
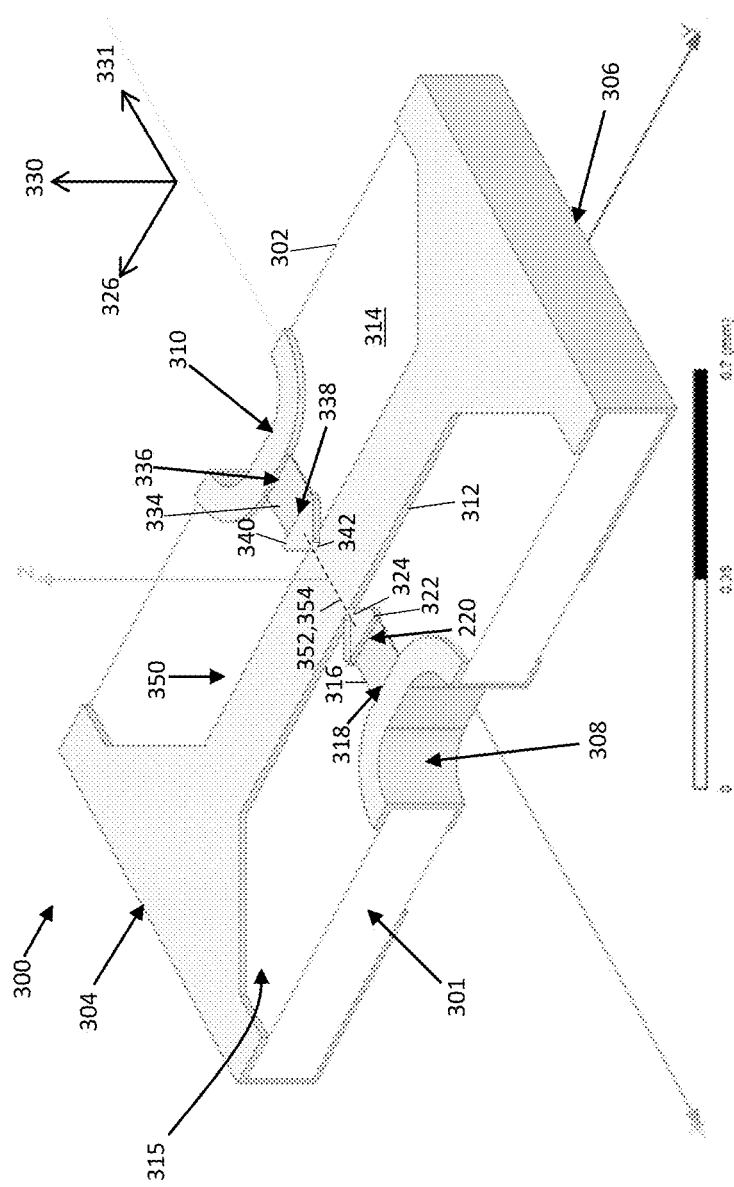
FIG. 3 illustrates an embodiment of a surface mount component that is generally similar to the surface mount component of FIG. 2 without a DC blocking capacitor.

FIG. 3 illustrates another embodiment of a surface mount component 300 according to aspects of the present disclosure. The surface mount component 300 can be generally similar to the surface mount component 200 of FIGS. 2A and 2B without the capacitor 250. Similar reference numerals are used in FIG. 3 as FIGS. 2A and 2B. The surface mount component 300 can be free of any capacitors. For example, the conductive trace 312 can be free of capacitors or other elements that would interrupt a direct current flow between the input terminal 304 and the second or output terminal 306.

Figure 4A:
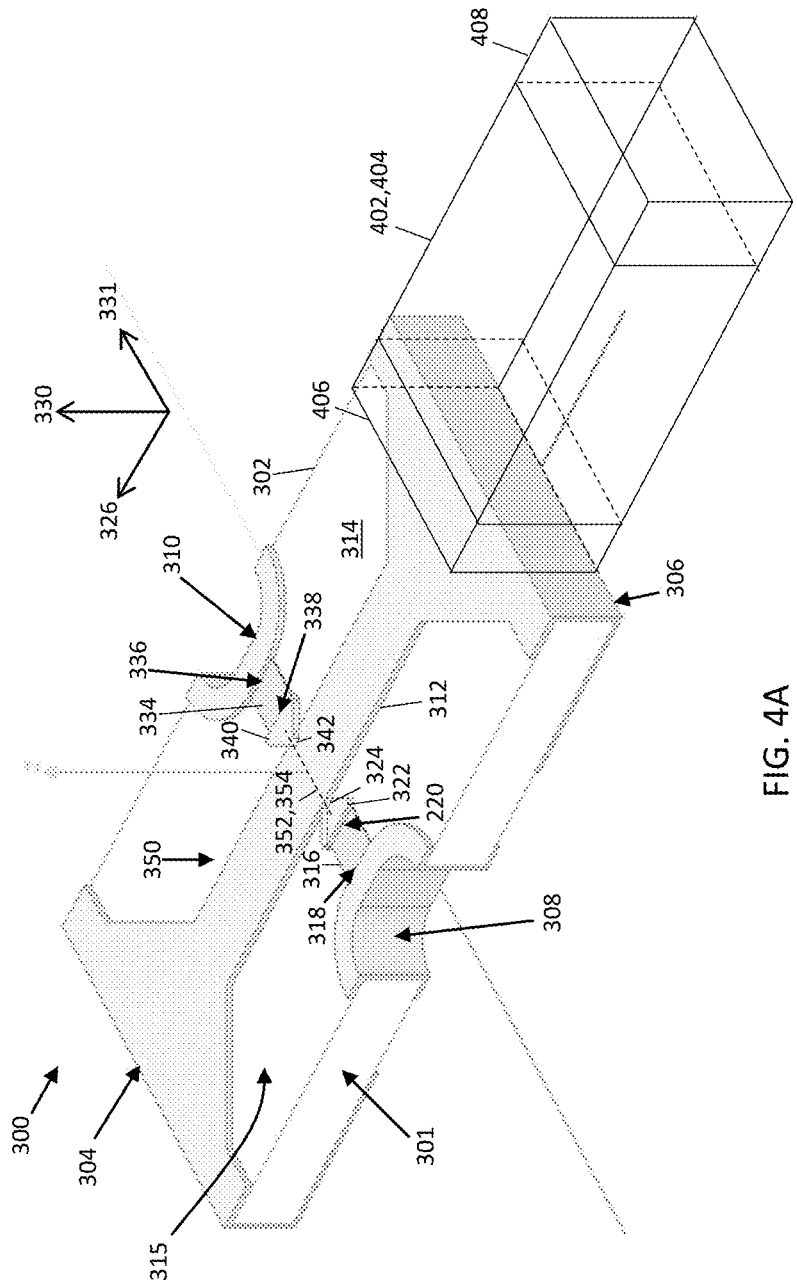
FIG. 4A illustrates an embodiment of a surface mount assembly including the surface mount component of FIG. 3 and a multi-layer ceramic capacitor connected in series.

FIG. 4A illustrates an embodiment of a surface mount assembly 400 according to aspects of the present disclosure. The surface mount assembly 400 can include the surface mount component 300 of FIG. 3 and a multi-layer ceramic capacitor 402. The capacitor 402 can include a monolithic body 404, a first external terminal 406, and a second external terminal 408. The capacitor can include a first plurality of active electrodes connected with the first external terminal 406 and a second plurality of active electrodes connected with the second external terminal 408. The surface mount assembly 400 can be connected in series with the surface mount component 300. For example, the first external terminal 406 of the surface mount assembly 400 can be connected with the output terminal 306 of the surface mount component 300, or the second external terminal 408 can be connected with the output terminal 306. However, it should be understood that the surface mount component 300 and multi-layer ceramic capacitor 402 can be mounted in any suitable configuration such that they are electrically connected in series. The multi-layer ceramic capacitor 402 can act as a DC blocking capacitor. In some embodiments, the capacitor 402 can be configured as a high frequency capacitor 1000, 1060, 1100 described below with reference to FIGS. 9A through 14D.

Figure 4B:
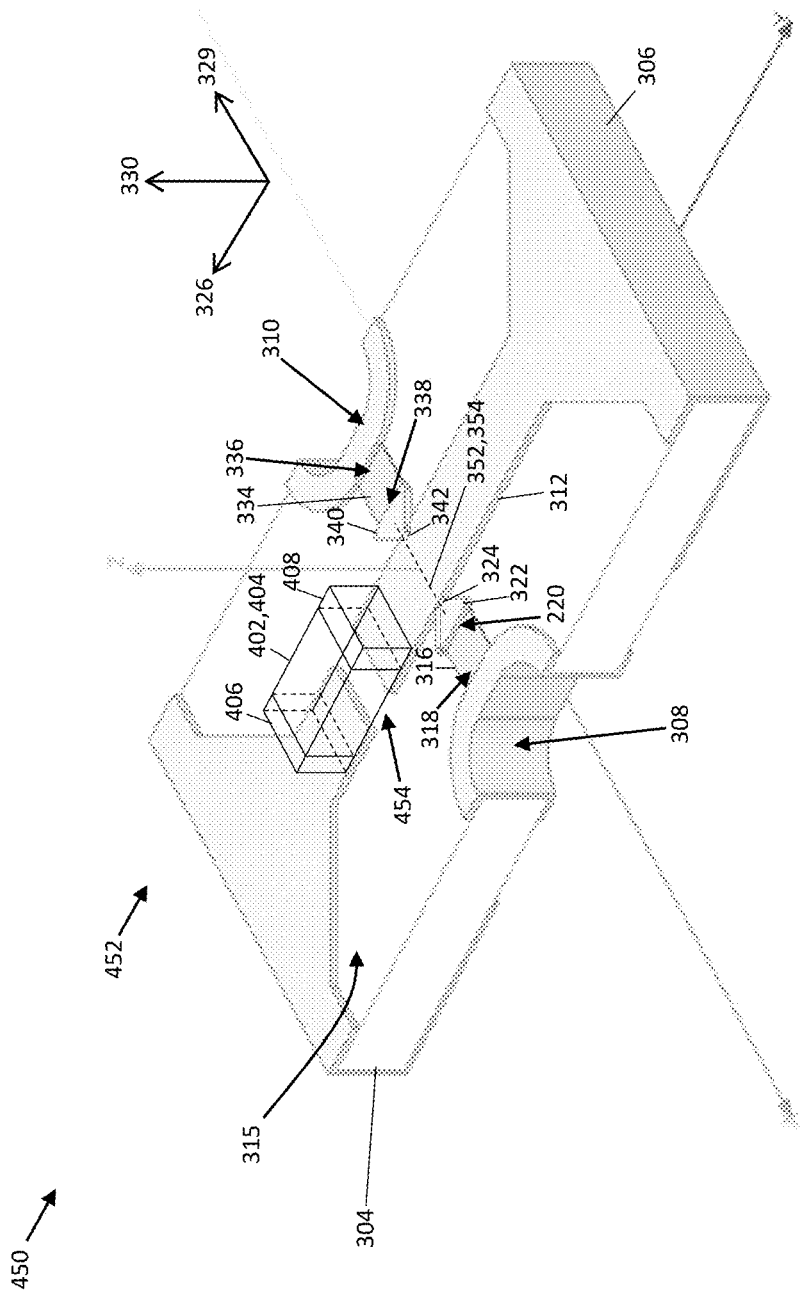
FIG. 4B illustrates an embodiment of a surface mount assembly including a surface mount component similar to the surface mount component FIG. 3 and a multi-layer ceramic capacitor connected in a signal path of the surface mount component.

FIG. 4B illustrates another embodiment of a surface mount assembly 450 according to aspects of the present disclosure. The surface mount assembly 450 can include a surface mount component 452 and a multi-layer ceramic capacitor 402. The surface mount component 452 can generally be similar to the surface mount component 300 of FIG. 3. However, the conductive trace 312 of the surface mount component 452 can define a gap 454 across which the multi-layer ceramic capacitor 402 is connected. The first external terminal 406 of the multi-layer ceramic capacitor 402 can be connected with the input terminal 304. The second external terminal 408 can be connected with the conductive trace 312 near the first location 352 at which the thin-film connector(s) 322, 340 connect with the conductive trace 312. Thus, the multi-layer ceramic capacitor 402 can act as a DC blocking capacitor, similar to the capacitor 250 of FIG. 2A.

It should be understood that surface mount component 100, 200, 300 described herein can be connected with a multilayer ceramic capacitor, such as capacitor 402, to form a surface mount assembly within the scope of this disclosure. In some embodiments, the capacitor can be configured as a high frequency capacitor 1000, 1060, 1100 described below with reference to FIGS. 9A through 14D.

Figure 5:
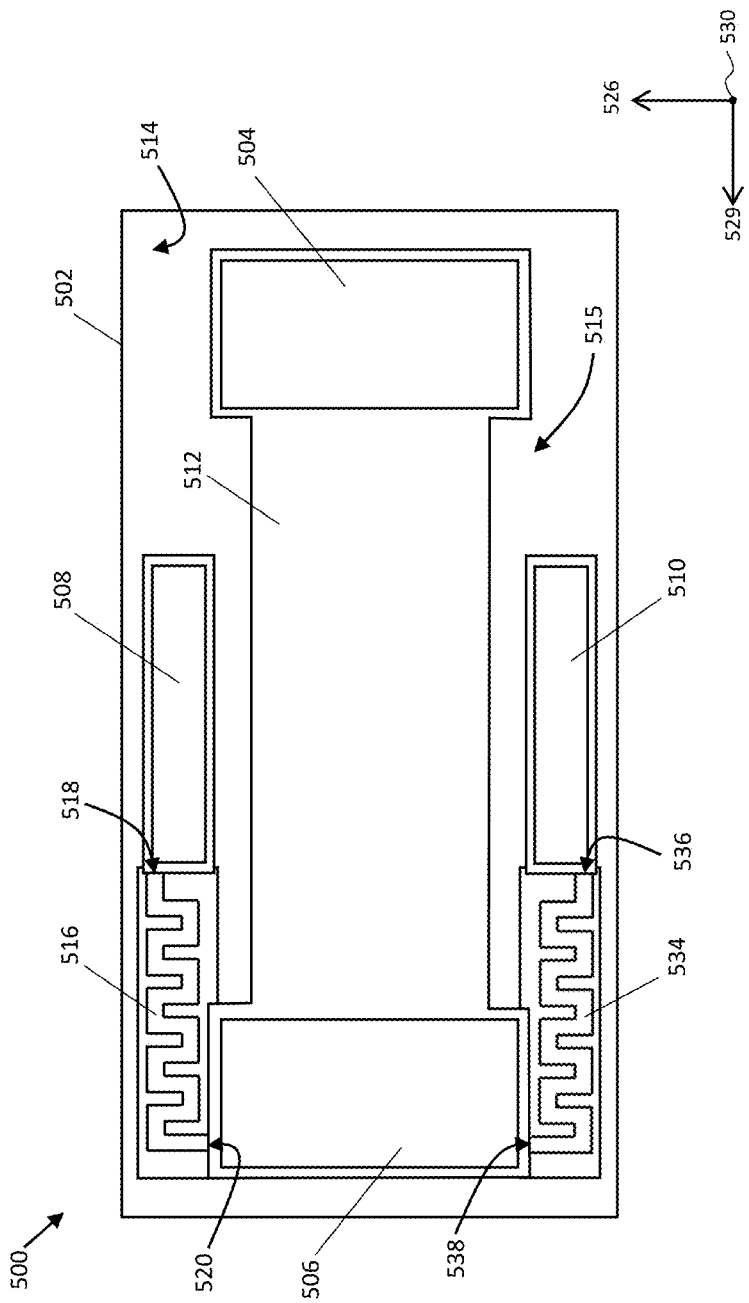
FIG. 5 illustrates a top view of another embodiment of a surface mount component according to aspects of the present disclosure.

Turning to FIG. 5, a top view is provided of another embodiment of a surface mount component according to aspects of the present disclosure. Reference numerals are used in FIG. 5 for the surface mount component 500 that are similar to the reference numerals used in FIGS. 1A through 4B.

FIG. 5 illustrates a surface mount component 500 including a monolithic substrate 502. An input terminal 504, an output terminal 506, a DC bias terminal 508, and an additional DC bias terminal 510 can connect with (e.g., be formed over) the monolithic substrate 502. A conductive trace 512 can be formed over a surface 514 of the monolithic substrate 502 included in a signal path 515 between the input terminal 504 and the second or output terminal 506.

A first resistor 516 can have a first end 518 connected with the DC bias terminal 508 and a second end 520 connected with the input terminal 504 or the output terminal 506, which are part of the signal path 515. As shown in FIG. 5, the first resistor 516 is connected between the DC bias terminal 508 and the output terminal 506. Thus, in such a configuration, the first resistor 516 is directly connected to the output terminal 506 and the DC bias terminal 508, rather than being connected to the output terminal 506 through the conductive trace 512, e.g., as shown in the embodiments depicted in FIGS. 1A-4B. However, the direct connection configuration of the surface mount component 500 illustrated in FIG. 5 behaves the same electrically as the embodiments of the surface mount components 100, 200, 300 described above.

In some embodiments, the first resistor 516 may be connected to the output terminal 506 rather than the input terminal 504 (e.g., as shown in FIG. 5) such that a surface mount assembly including the surface mount component 500 and a capacitor, such as capacitor 402 described herein, may have the first resistor 516 positioned after the capacitor 402. That is, the first resistor 516 may be positioned between the capacitor 402 and the output terminal 506.

The first resistor 516 can be configured to reduce and/or prohibit AC perturbances from being introduced to the output terminal 506 from the DC bias terminal 508. For example, the second end 520 of the first resistor 516 can have a relatively small cross-sectional area that can function to reduce and/or prohibit the AC perturbances from passing therethrough. For instance, the second end 520 can have a cross-sectional area in a plane that is perpendicular to the surface 514 of the monolithic substrate 502, e.g., the cross-sectional area can be defined in a YZ plane that is aligned with a Z-direction 530 (extending into and out of the page) and a Y-direction 526. The surface 514 lies in an XY plane that includes the Y-direction 526 and an X-direction 529 that is perpendicular to each of the Y-direction 526 and the Z-direction 530. The second end 520 can have a width in the Y-direction 526 such that the width lies in an XY plane that is parallel to the surface 514. The cross-sectional area of the second end 520 can be relatively small, e.g., due a small width in the Y-direction 526 and/or small height in the Z-direction 530, such that the first resistor 516 has a relatively small connection to the output terminal 506 to minimize perturbance from the DC bias terminal 508.

As further illustrated in FIG. 5, the surface mount component 500 may include a second resistor 534, which may be configured substantially similar to the first resistor 516 but may be connected with the additional DC bias terminal 510 rather than the DC bias terminal 508. For example, the second resistor 534 can have a first end 536 connected with the additional DC bias terminal 510 and a second end 538 connected with the input terminal 504 or the output terminal 506. In the embodiment of FIG. 5, the second end 538 of the second resistor 534 is connected with the output terminal 506. In the embodiment shown in FIG. 5, the second resistor 534 is otherwise substantially similar to the first resistor 516; for instance, the second resistor 534 has a relatively small connection (e.g., through a relatively small cross-sectional area at the second end 538) with the output terminal 506 to minimize perturbance from the additional DC bias terminal 510.

In some embodiments, the first resistor 516 and/or the second resistor 534 may be connected to the output terminal 506 via a conductive thin-film connector, such as the first conductive thin-film connector 122 and/or second conductive thin-film connector 140 described above. Further, it will be appreciated that the respective second ends 520, 538 of the first and second resistors 516, 534 (or the first and/or second conductive thin-film connectors, for embodiments including such connectors) can have a variety of shapes within the scope of this disclosure. For example, the second end 520 of the first resistor 516 can have a pair of substantially straight edges similar to the substantially straight edges 123, 125 that converge at the location where the second end 520 intersects the output terminal 506. However, in other embodiments, the edges of the second end 520 can be curved and/or can include a plurality of stair steps that converge at the location of the intersection between the second end 520 and the output terminal 506. The second ends 520, 538 (or the respective conductive thin-film connectors connecting the second end 520, 538 to the output terminal 506) can have any suitable shape that includes a narrow point such as described above with respect to narrow points 124, 142.

Moreover, as illustrated in FIGS. 1A through 5, each resistor may have any suitable shape. For example, the first resistor 116 and second resistor 134 may be configured as generally rectangular shaped thin-film resistors as shown in FIGS. 1A through 10. In other embodiments, the first resistor 516 and second resistor 534 may be configured as generally serpentine shaped thin-film resistors as shown in FIG. 5. In some embodiments, the first resistor and the second resistor may be shaped differently from one another and/or may be shaped differently from the embodiments shown herein. It will be appreciated that a body of the respective resistor may have any appropriate shape, e.g., to achieve a desired resistance value for the given resistor, but one or both ends of the respective resistor may have a relatively small cross-sectional shape as described herein to minimize perturbances.

Figure 6:
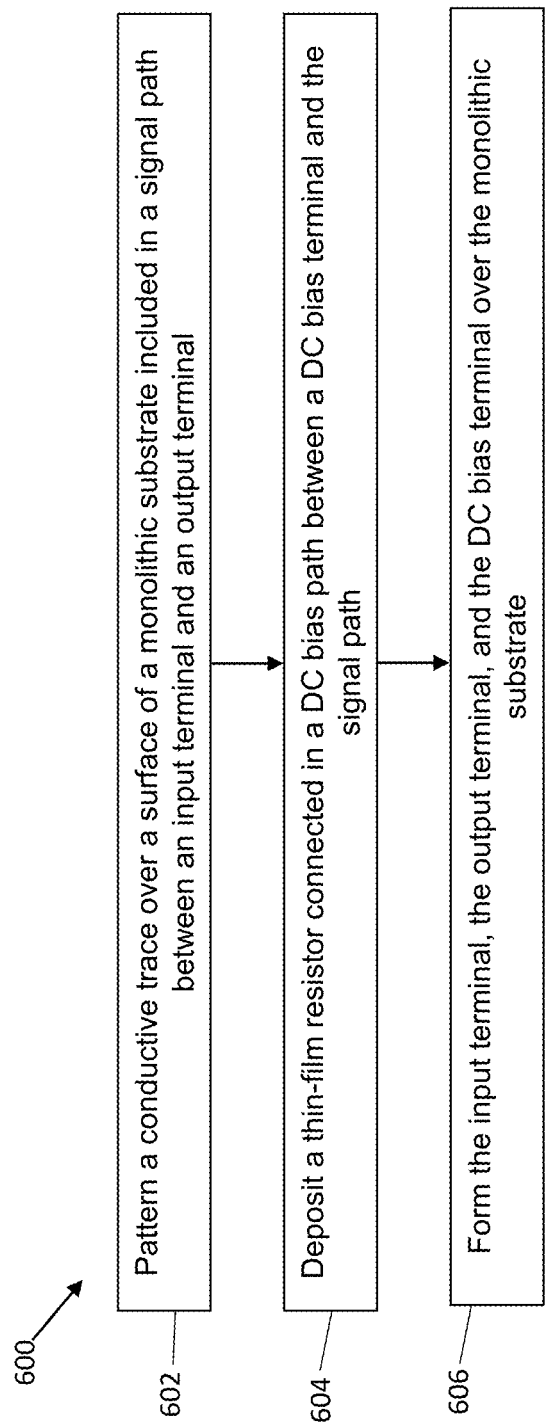
FIG. 6 is a flowchart of a method for forming a surface mount component according to aspects of the present disclosure.

Referring to FIG. 6, aspects of the present disclosure are directed to a method 600 for forming a surface mount component. In general, the method 600 will be described herein with reference to the surface mount components 100, 200, described above with reference to FIGS. 1A-2B. However, it should be appreciated that the disclosed method 600 may be implemented with any resistive splitters, such as any of the embodiments described with respect to FIGS. 1A through 5. In addition, although FIG. 6 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 600 can include, at 602, patterning a conductive trace 112, 212 over a surface 114, 214 of the monolithic substrate 102, 202 included in a signal path 115, 215 between an input terminal (e.g., the input terminal 104, 204) and an output terminal (e.g., the second terminal 106, 206). The conductive trace 112, 212 can similarly be formed using any suitable thin-film technique.

The method 600 can include, at 604, depositing a thin-film resistor (e.g., the first resistor 116, 216) connected in a DC bias path between the DC bias terminal (e.g., the third terminal 108, 208) and the signal path 115, 215, such as between the DC bias terminal and the conductive trace 112, 212. The resistor can include a variety of suitable materials, such as chrome silicon and silicon chromium. The DC bias path can have a narrow point having a cross-sectional area in a plane that is perpendicular to the surface 114, 214 of the monolithic substrate 102, 202. The cross-sectional area of the narrow point can be less than about 1,000 square microns. In some embodiments, a width of the narrow point can be less than 100 microns.

The method 600 can include, at 606, forming the input terminal (e.g., the input terminal 104, 204), the output terminal, (e.g., the second terminal 106, 206) and the DC bias terminal (e.g., the DC bias terminal 108, 208) over the monolithic substrate 202. In some embodiments, the surface mount component 100, 200 may include only three terminals, as described with reference to FIG. 1D, instead of four terminals, as described above with reference to FIGS. 1A through 10 and FIGS. 2A and 2B. The terminals 104, 204, 106, 206, 108, 208, 110, 210 can be formed using any suitable thin-film technique, such as photolithography or any other suitable patterning technique, etching, PECVD (Plasma Enhanced Chemical Vapor Deposition) processing, or other additive and/or subtractive techniques.

In some embodiments, the method 600 can include forming an additional DC bias terminal 110, 210. The method 600 can include forming a second or additional thin-film resistor 134, 234 between the signal path 115, 215 and the additional DC bias terminal 110, 210, such as between the conductive trace 112, 212 and the additional DC bias terminal 110, 210.

The resistor 116, 216, and/or the narrow points 124, 142, 224, 242 of the first conductive thin-film connector 122 can reduce and/or prohibit the AC perturbances from passing therethrough. At least one of the first conductive thin-film connector 122, 222 or the second conductive thin-film connector 140, 240 can have respective narrow points 124, 142, 224, 242 having respective cross-sectional areas in the YZ plane that is perpendicular to the surface 114, 214 of the monolithic substrate 102, 202. The cross-sectional area(s) can be less than about 1,000 square microns.

Figure 7A:
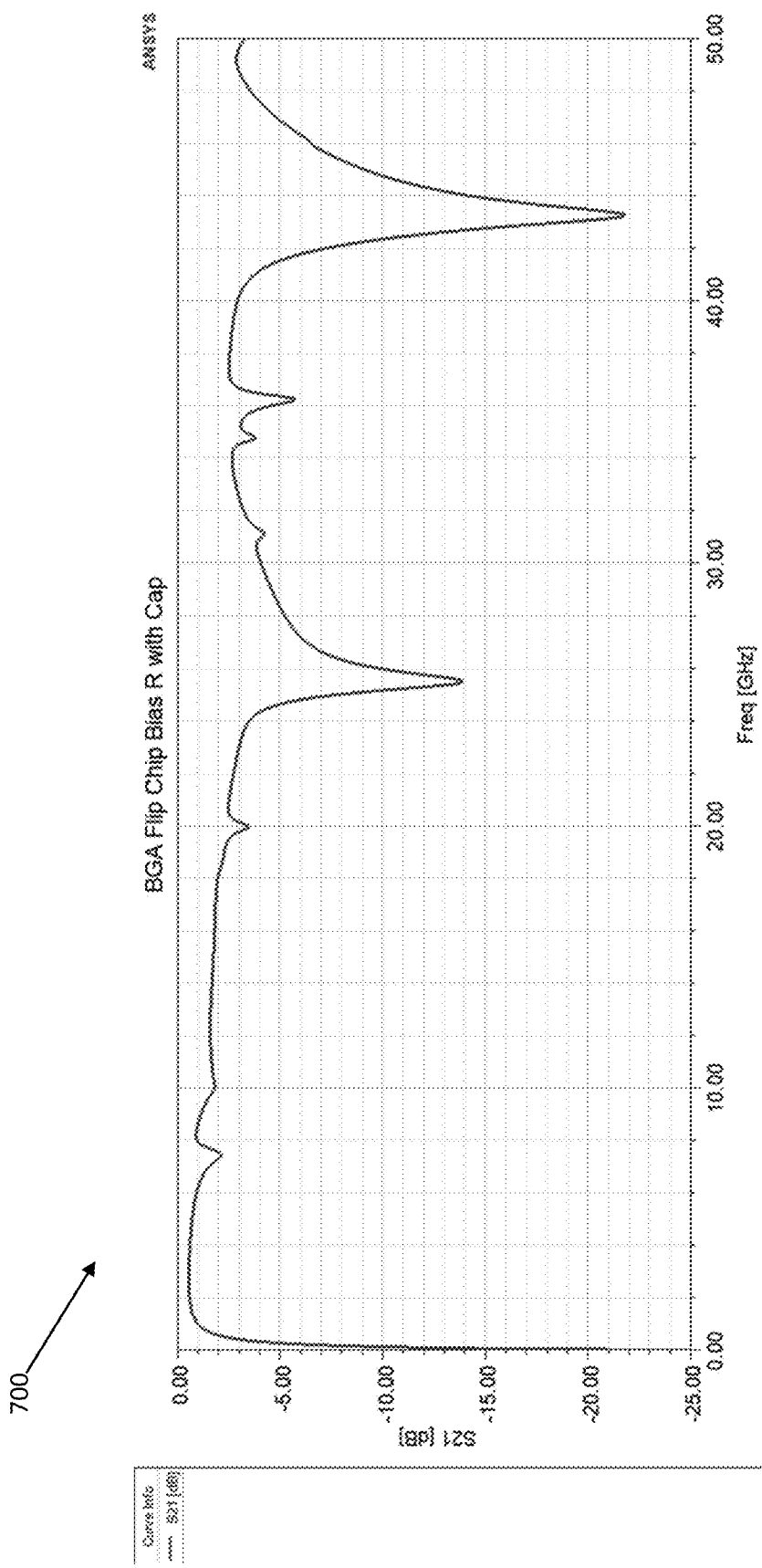
FIG. 7A illustrates an insertion loss response curve ($S_{21}$) between the input terminal (port 1) and the output terminal (port 2) of the surface mount component of FIG. 1C.

FIG. 7A illustrates an insertion loss response curve 700 ($S_{21}$) for the surface mount component 180 of FIG. 1C between the input terminal 104 (port 1) and the output terminal 106 (port 2). The surface mount component 180 of FIG. 1C includes the capacitor 182 in the signal path, as described above with respect to FIG. 3. The surface mount component 180 of FIG. 1C can be configured for grid array type mounting, such as ball grid array type mounting. The insertion loss response curve 700 was generated using computer modeling. The insertion loss of the surface mount component 300 was greater than −5 dB for frequencies ranging from about 1 GHz to about 24 GHz. The insertion loss of the surface mount component 180 was greater than −10 dB for frequencies ranging from about 1 GHz to about 24 GHz and from about 28 GHz to about 40 GHz.

Figure 7B:
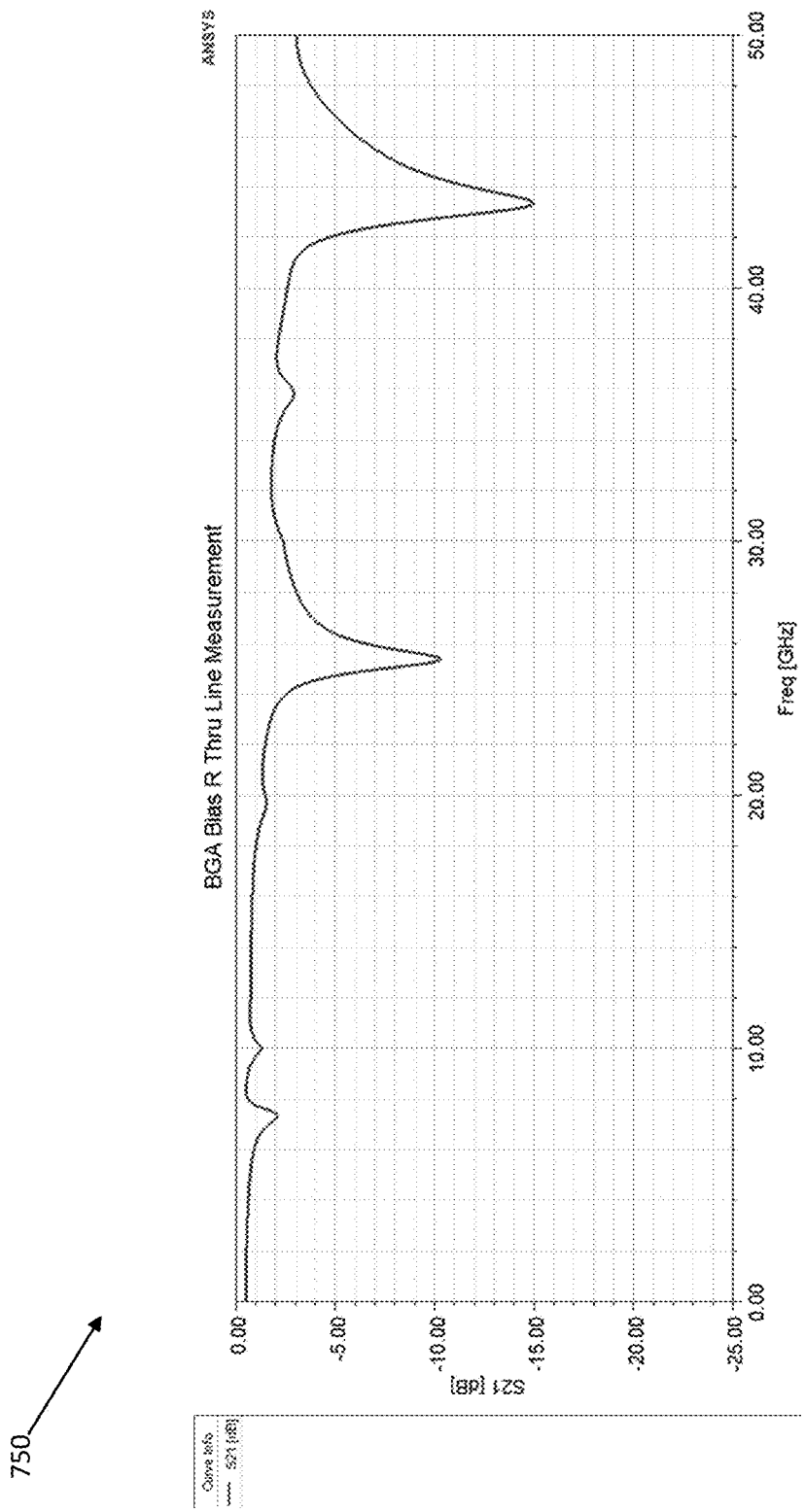
FIG. 7B illustrates an insertion loss response curve ($S_{21}$) between the input terminal (port 1) and the output terminal (port 2) of the surface mount component of FIGS. 1A and 1B.

FIG. 7B illustrates an insertion loss response curve 750 ($S_{21}$) for the surface mount component 100 of FIGS. 1A and 1B between the input terminal 104 (port 1) and the output terminal 106 (port 2). The surface mount component 100 of FIGS. 1A and 1B does not include a capacitor in the signal path, as described above with reference to FIGS. 1A and 1B. The surface mount component 100 of FIGS. 1A and 1B can be configured for grid array type mounting, such as ball grid array type mounting. The insertion loss response curve 750 was generated using computer modeling. The insertion loss of the surface mount component 100 was greater than −5 dB for frequencies ranging from about 1 GHz to about 24 GHz. The insertion loss of the surface mount component 100 was greater than −10 dB for frequencies ranging from about 1 GHz to about 24 GHz and from about 28 GHz to about 40 GHz.

Figure 8:
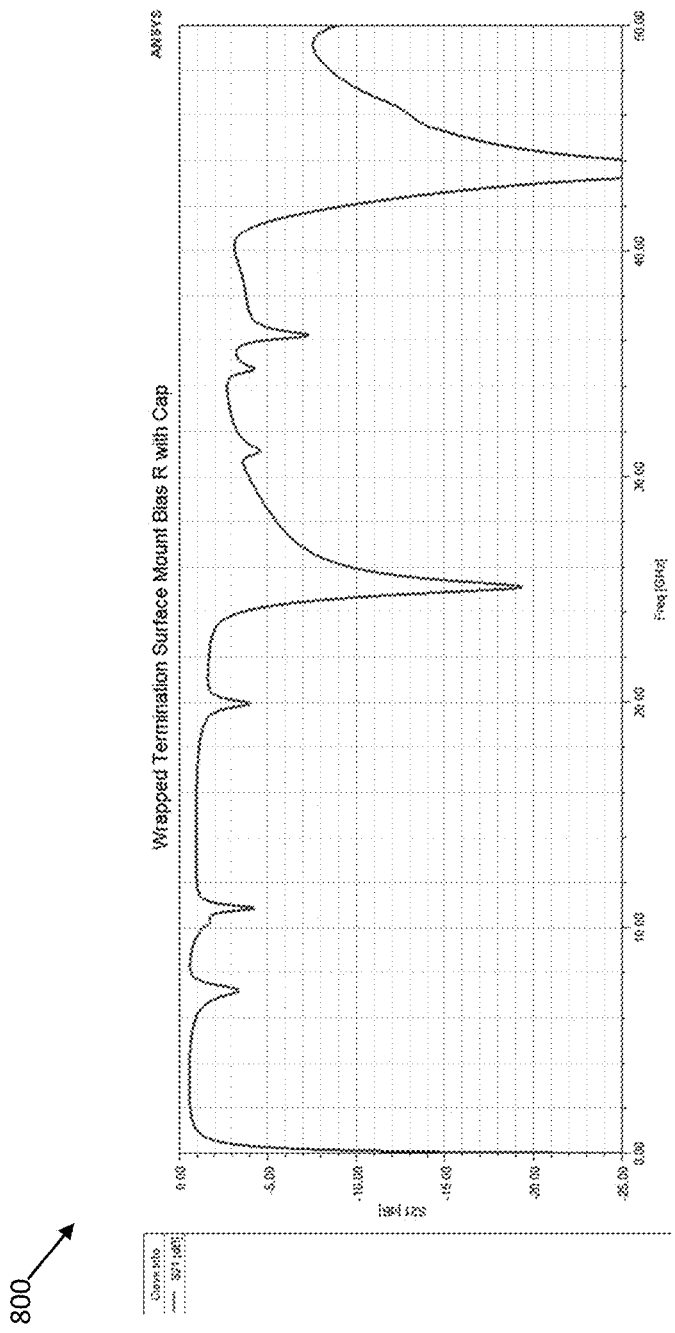
FIG. 8 illustrates an insertion loss response curve ($S_{21}$) between the input terminal (port 1) and the output terminal (port 2) for the surface mount component of FIGS. 2A and 2B.

FIG. 8 illustrates an insertion loss response curve 800 ($S_{21}$) for the surface mount component 200 of FIGS. 2A and 2B between the input terminal 204 (port 1) and the output terminal 206 (port 2). The insertion loss response curve 800 was generated using computer modeling. The insertion loss of the surface mount component 200 was greater than −5 dB for frequencies ranging from about 1 GHz to about 24 GHz. The insertion loss of the surface mount component 200 was greater than −10 dB for frequencies ranging from about 1 GHz to about 24 GHz and from about 27 GHz to 42 GHz.

Figure 9A:
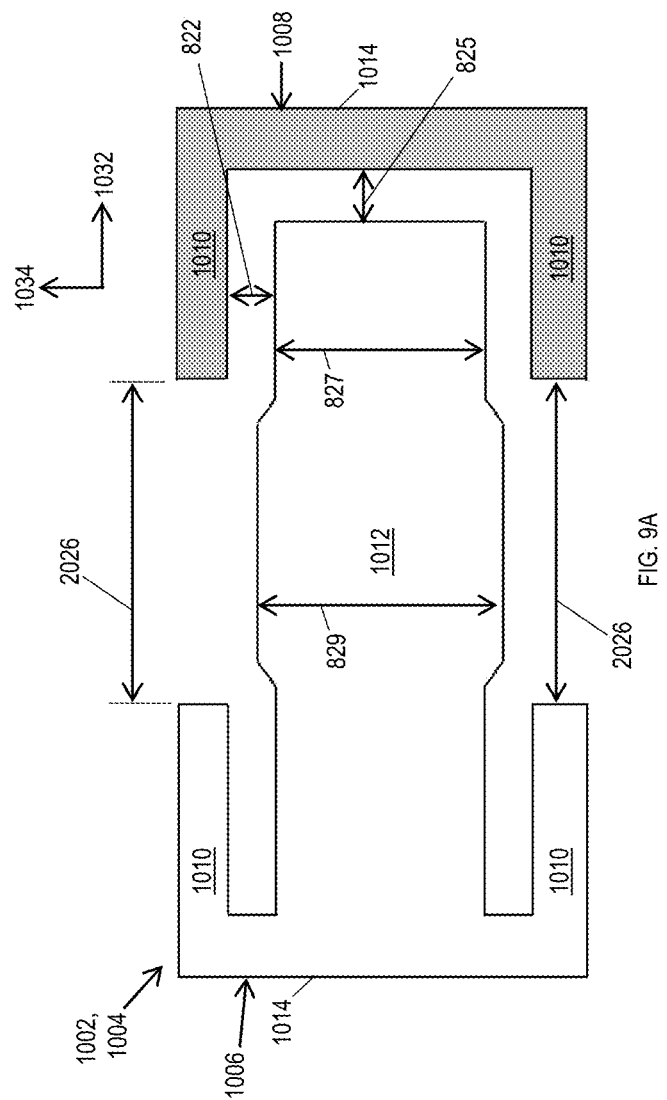
FIG. 9A illustrates a top view of one embodiment of an active electrode layer according to aspects of the present disclosure.
Figure 9B:
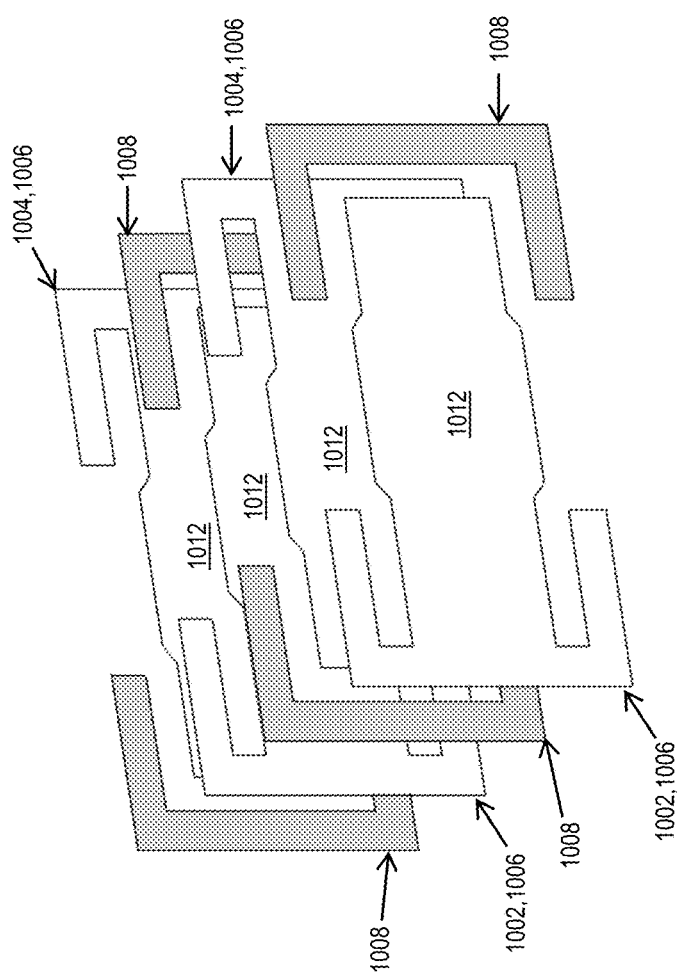
FIG. 9B illustrates a perspective view of alternating electrode layers configured as shown in FIG. 9A according to aspects of the present disclosure.
Figure 9C:
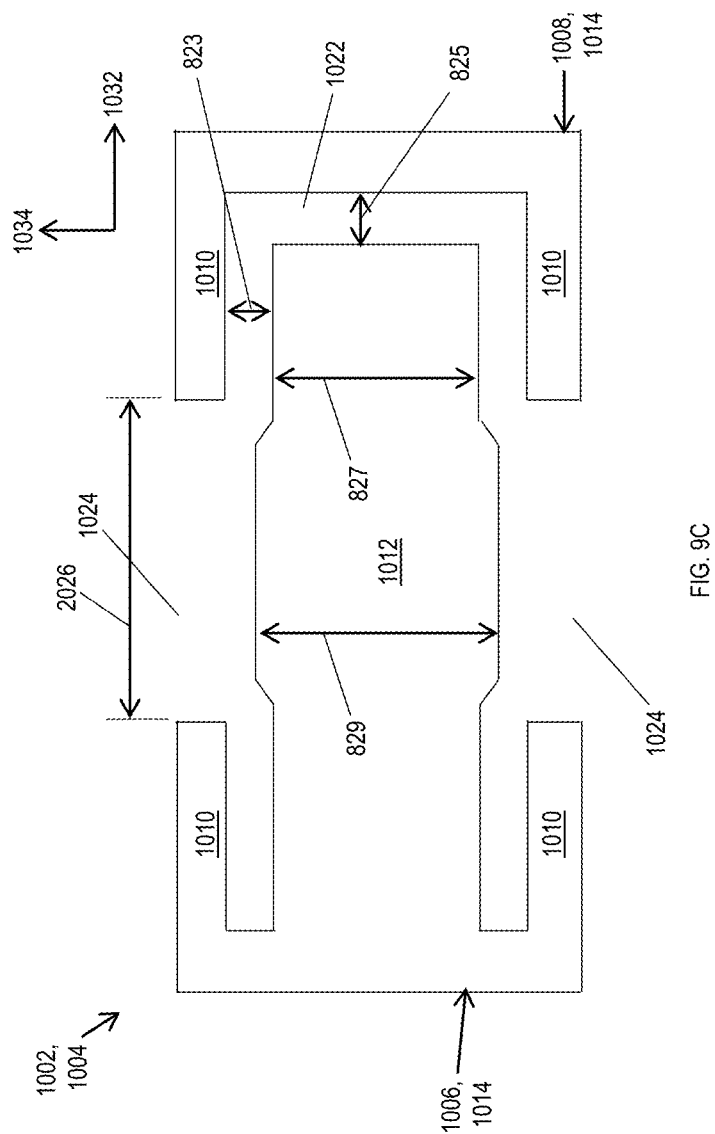
FIG. 9C illustrates a top down view of the embodiment of the active electrode layer of FIG. 9A in which multiple capacitive regions are formed according to aspects of the present disclosure.
Figure 9E:
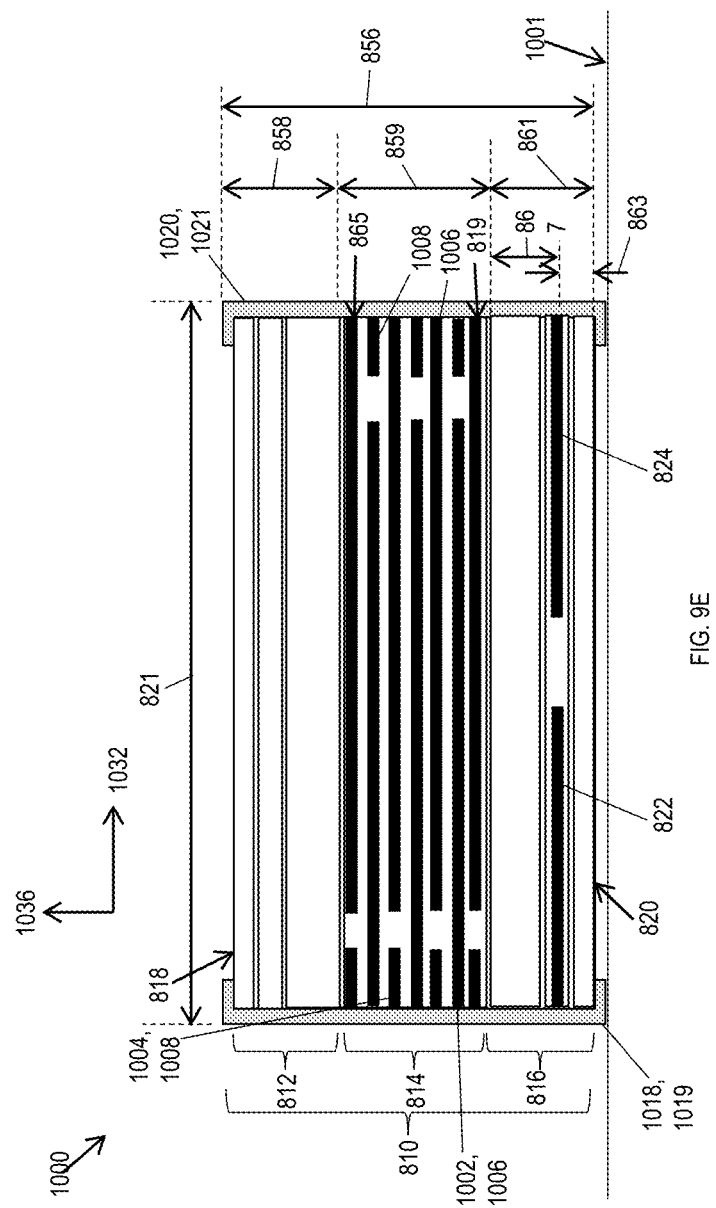
FIG. 9E illustrates a side cross sectional view of one embodiment of a capacitor including multiple regions in which active electrode layers are configured as shown in FIGS. 9A through 9C and a shield electrode layer is configured as shown in FIG. 9D according to aspects of the present disclosure.

Turning to FIGS. 9A-9E, one embodiment of a broadband multilayer ceramic capacitor 1000 is disclosed. FIG. 9E is a simplified side elevation view of the capacitor 1000 mounted to a mounting surface 1001, such a printed circuit board or substrate. The capacitor 1000 may include a plurality of electrode regions 810 that are stacked in the Z-direction 1036. The plurality of electrode regions 810 may include a dielectric region 812, an active electrode region 814, and a shield electrode region 816. The active electrode region 814 may be located between the dielectric region 812 and the shield electrode region 816 in the Z-direction 1036. The dielectric region 812 may extend from the active electrode region 814 to a top surface 818 of the broadband multilayer ceramic capacitor 1000. The capacitor 1000 may include a bottom surface 820 opposite the top surface 18 in the Z-direction 1036.

The electrode regions 810 may include a plurality of dielectric layers. Some dielectric layers may include electrode layers formed thereon. In general, the thickness of the dielectric layers and the electrode layers is not limited and can be any thickness as desired depending on the performance characteristics of the capacitor. For instance, the thickness of the electrode layers can be, but is not limited to, being about 500 nm or greater, such as about 1 µm or greater, such as about 2 µm or greater, such as about 3 µm or greater, such as about 4 µm or greater to about 10 µm or less, such as about 5 µm or less, such as about 4 µm or less, such as about 3 µm or less, such as about 2 µm or less. For instance, the electrode layers may have a thickness of from about 1 µm to about 2 µm. In addition, in one embodiment, the thickness of the dielectric layer may be defined according to the aforementioned thickness of the electrode layers. Also, it should be understood that such thicknesses of the dielectric layers may also apply to the layers between any active electrode layers, and/or shield electrode layers, when present and as defined herein.

In general, the present invention provides a multilayer capacitor having a unique electrode arrangement and configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The electrode layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. The electrodes may also be made of a low resistive material, such as silver, copper, gold, aluminum, palladium, etc. In one particular embodiment, the electrode layers may comprise nickel or an alloy thereof.

Referring again to FIG. 9E, in some embodiments, the dielectric region 812 may be free of electrode layers that extend greater than about 40% of a length 821 of the capacitor 1000 from a first end 1019 or a second end 1021 of the capacitor 1000, in some embodiments free of electrode layers that extend greater than about 25% of the length of the capacitor, in some embodiments free of electrode layers that extend greater than about 20% of the length of the capacitor, in some embodiments greater than about 15% of the length of the capacitor, in some embodiments greater than about 10% of the length of the capacitor, in some embodiments greater than about 5% of the length of the capacitor, and in some embodiments greater than about 2% of the length of the capacitor. For example, in such embodiments, the dielectric region 812 may include one or more floating electrodes and/or dummy electrode tabs. However, in other embodiments, the dielectric region 812 may be free of all electrode layers. In some embodiments, the broadband multilayer ceramic capacitor 1000 may be free of shield electrodes 822, 824 above a plurality of active electrode layers 1002, 1004 in the Z-direction 1036. In some embodiments, the broadband multilayer ceramic capacitor 1000 may be free of shield electrodes 822, 824 above a lowest electrode layer 819 of the plurality of active electrode layers 1002, 1004 in the Z-direction 1036.

The plurality of active electrode layers 1002, 1004 may be arranged within the active electrode region 814. Each active electrode layer 1002, 1004 may include one or more active electrodes, for example as described below with reference to FIGS. 9A through 9C. For example, in some embodiments each active electrode layer 1002, 1004 may include a first electrode 1006 and a second electrode 1008.

The capacitor 1000 may contain a first external terminal 1018 connected to the first electrode 1006 of a first active electrode layer 1002 and a second (counter) electrode 1008 of the second active electrode layer 1004. The capacitor 1000 may include a second external terminal 1020 connected to the first electrode 1006 of the second active electrode layer 1004 and the second (counter) electrode 1008 of the first active electrode layer 1002.

The shield electrode region 816 may include one or more shield electrodes, for example as described below with reference to FIG. 9D. For example, the shield electrode region 16 may include a first shield electrode 822 arranged within a monolithic body of the capacitor 1000. The first shield electrode 822 may be parallel with the longitudinal direction 1032. The first shield electrode 822 may be connected with the first external terminal 1018. The shield electrode region 16 may include a second shield electrode 824, which may be connected with the second external terminal 1020. The second shield electrode 824 may be approximately aligned with the first shield electrode 822 in the Z-direction 1036.

In general, regarding embodiments discussed herein, the external terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

In one embodiment, the external terminals may be formed such that the external terminals are relatively thick. For instance, such terminals may be formed by applying a thick film stripe of a metal to exposed portions of electrode layers (e.g., by dipping the capacitor in a liquid external terminal material). Such metal may be in a glass matrix and may include silver or copper. As an example, such strip may be printed and fired onto the capacitor. Thereafter, additional plating layers of metal (e.g., nickel, tin, solder, etc.) may be created over the termination strips such that the capacitor is solderable to a substrate. Such application of thick film stripes may be conducted using any method generally known in the art (e.g., by a termination machine and printing wheel for transferring a metal-loaded paste over the exposed electrode layers).

The thick-plated external terminals may have an average thickness of about 150 µm or less, such as about 125 µm or less, such as about 100 µm or less, such as about 80 µm or less. The thick-plated external terminals may have an average thickness of about 25 µm or more, such as about 35 µm or more, such as about 50 µm or more, such as about 75 or more µm. For instance, the thick-plated external terminals may have an average thickness of from about 25 µm to about 150 µm, such as from about 35 µm to about 125 µm, such as from about 50 µm to about 100 µm.

In another embodiment, the external terminals may be formed such that the external terminal is a thin-film plating of a metal. Such thin-film plating can be formed by depositing a conductive material, such as a conductive metal, on an exposed portion of an electrode layer. For instance, a leading edge of an electrode layer may be exposed such that it may allow for the formation of a plated termination.

The thin-plated external terminals may have an average thickness of about 50 µm or less, such as about 40 µm or less, such as about 30 µm or less, such as about 25 µm or less. The thin-plated external terminals may have an average thickness of about 5 µm or more, such as about 10 µm or more, such as about 15 µm or more. For instance, the external terminals may have an average thickness of from about 5 µm to about 50 µm, such as from about 10 µm to about 40 µm, such as from about 15 µm to about 30 µm, such as from about 15 µm to about 25 µm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective electrode layers within a set of alternating dielectric layers and electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the electrode layers of the capacitor. For instance, when the electrode layer comprises nickel and the activation dopant comprises palladium, the palladium dopant may be introduced into the nickel ink or composition that forms the electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal may include at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as a barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the electrode layers. Such phenomena may be referred to as "self-determining" because the formation of the external plated terminals is determined by the configuration of the exposed conductive metal of the electrode layers at the selected peripheral locations on the capacitor. In some embodiments, the capacitor may include "dummy tabs" to provide exposed conductive metal along portions of the monolithic body of the capacitor that does not include other electrodes (e.g., active or shield electrodes).

It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

In the active electrode region 814 according to aspects of the present disclosure. More specifically, the active electrode region 814 may include first active electrode layers 1002 and second active electrode layers 1004 in an alternating arrangement, for example as described below with reference to FIG. 9B. Referring to FIG. 9A, each active electrode layer 1002, 1004 may include a first electrode 1006 and a second electrode 1008. The first electrode 1006 may have a base portion 1014 that extends along a longitudinal edge of the first electrode 1006 in the lateral direction 1034. The first electrode 1006 may have a pair of electrode arms 1010 extending from a base portion 1014 in the longitudinal direction 1032. The second electrode 1008 may have a base portion 1014 that extends along a longitudinal edge of the second electrode layer 1008 in the lateral direction 1034. The second electrode 1008 may have a pair of electrode arms 1010 extending from the base portion 1014 in the longitudinal direction 1032.

The electrode arm(s) 1010 of the first electrode 1006 may be generally longitudinally aligned with respective the electrode arm(s) 1010 of the second electrode 1008. Arm gap(s) 2026 may be defined in the longitudinal direction 1032 between aligned electrode arms 1010 of the first and second electrodes 1006, 1008.

A central edge gap distance 823 may be defined in the lateral direction 1034 between the central portion 1012 of the first electrode and the second electrode arm 1010. A central end gap distance 825 may be defined in the longitudinal direction 1032 between the central portion 1012 of the first electrode 1006 and the base portion 1014 of the second electrode 1008. In some embodiments, the central edge gap distance 823 may be approximately equal to the central end gap distance 825.

The central portion 1012 of the first electrode 1006 may have a first width 827 at a first location and a second width 829 at a second location that is greater than the first width 827. The first location of the first width 827 may be offset from the second location of the second width in the longitudinal direction 1032. Such a configuration may allow for adjustment of an overlapping area between central portions 1012 of adjacent electrodes in the Z-direction 1036 without changing the central edge gap distance 823.

Referring to FIG. 9B, a plurality of first active electrode layers 1002 and a plurality of second active electrode layers 1004 may be arranged in an alternating, mirrored configuration. As illustrated, the central portions 1012 of the respective electrode layers at least partially overlap. FIG. 9B illustrates a total of four electrode layers; however, it should be understood that any number of electrode layers may be employed to obtain the desired capacitance for the desired application.

Referring to FIG. 9C, several capacitive regions may be formed between the first electrode 1006 and the second electrode 1008. For example, in some embodiments, a central capacitive region 1022 may be formed between the central portion 1012 of the first electrode 1006 and the base portion 1014 and/or arms 1010 of the second electrode 1008. In some embodiments, an arm gap capacitive region 1024 may be formed within the main arm gap 2040 between the electrode arms 1010 of the first electrode 1006 and the second electrode 1008.

FIG. 9D illustrates a shield electrode layer 826, which may be included within the shield electrode region 816 (illustrated in FIG. 9E) within the monolithic body of the capacitor 1000. As indicated above, the first shield electrode 822 may be parallel with the longitudinal direction 1032 (e.g., parallel with the top and bottom surfaces 818, 820 illustrated in FIG. 9E). The first shield electrode 822 may have a first longitudinal edge 828 aligned with the lateral direction 1034 and facing away from the first external terminal 1018 (shown in FIG. 9E) and first end 1019. The first shield electrode 822 may have a second longitudinal edge 830 aligned with the lateral direction 1034 and facing away from the first external terminal (shown in FIG. 9E) and first end 1019. The second longitudinal edge 830 may be offset in the longitudinal direction 1032 from the first longitudinal edge 828 by a shield electrode offset distance 832.

The second shield electrode 824 may be connected with the second external terminal 1020 (illustrated in FIG. 9E) and the second end 1021. The second shield electrode 824 may be approximately aligned with the first shield electrode 822 in the Z-direction 1036 (illustrated in FIG. 9E). The second shield electrode 824 may have a similar configuration to the first shield electrode 822. For example, the second shield electrode 824 may have a first longitudinal edge 828 aligned with the lateral direction 1034 and facing away from the second external terminal 1020 (illustrated in FIG. 9E) and second end 1021. The second shield electrode 824 may have a second longitudinal edge 830 aligned with the lateral direction 1034 and facing away from the second external terminal 1020 (illustrated in FIG. 9E) and second end 1021. The second longitudinal edge 830 of the second shield electrode 824 may be offset from the first longitudinal edge 828 of the second shield electrode 824 by the shield electrode offset distance 832 in the longitudinal direction 1032.

A first shield capacitive region 834 may be formed between the first longitudinal edges 828 of the first and second shield electrodes 822, 824. A second shield capacitive region 836 may be formed between the second longitudinal edges 830 of the first and second shield electrodes 822, 824. In some embodiments, a width 838 of the first longitudinal edge 828 in the lateral direction 1034 may be less than a width 840 of the first shield electrode 822 in the lateral direction 1034.

A first shield gap distance 842 may be formed in the longitudinal direction 1032 between the first longitudinal edge 828 of the first shield electrode 822 and the first longitudinal edge 828 of the second shield electrode 824. A second shield gap distance 844 may be formed in the longitudinal direction 1032 between the second longitudinal edge 830 of the first shield electrode 822 and the second longitudinal edge 830 of the second shield electrode 822.

In some embodiments, a third shield gap distance 846 may be formed between a third longitudinal edge 848 of the first shield electrode 822 and a third longitudinal edge 848 of the second shield electrode 824. A third shield capacitive region 851 may be formed between the third longitudinal edges 848 of the first and second shield electrodes 822, 824. In some embodiments, the third shield gap distance 846 may be approximately equal to the second shield gap distance 844 such that the third shield capacitive region 851 may be substantially similar in size and shape to the second shield capacitive region 836. For example, in some embodiments the first shield electrode 822 and/or second shield electrode 824 may be symmetric in the lateral direction 1034 about a longitudinal centerline 850 that extends in the longitudinal direction 1032.

In other embodiments, however, the third shield gap distance 846 may be greater than or less than the second shield gap distance 844 such that the third shield capacitive region 851 is differently sized and/or shaped than the second shield capacitive region 836 and produces a different capacitance than the second capacitive region.

It should be understood that, in some embodiments, one or more of the shield electrodes 822, 824 may be rectangular. In other words, the shield electrode offset distance 832 may be zero or approximately zero such that the first longitudinal edge 828 and second longitudinal edge 830 are aligned or approximately aligned.

Figure 10B:
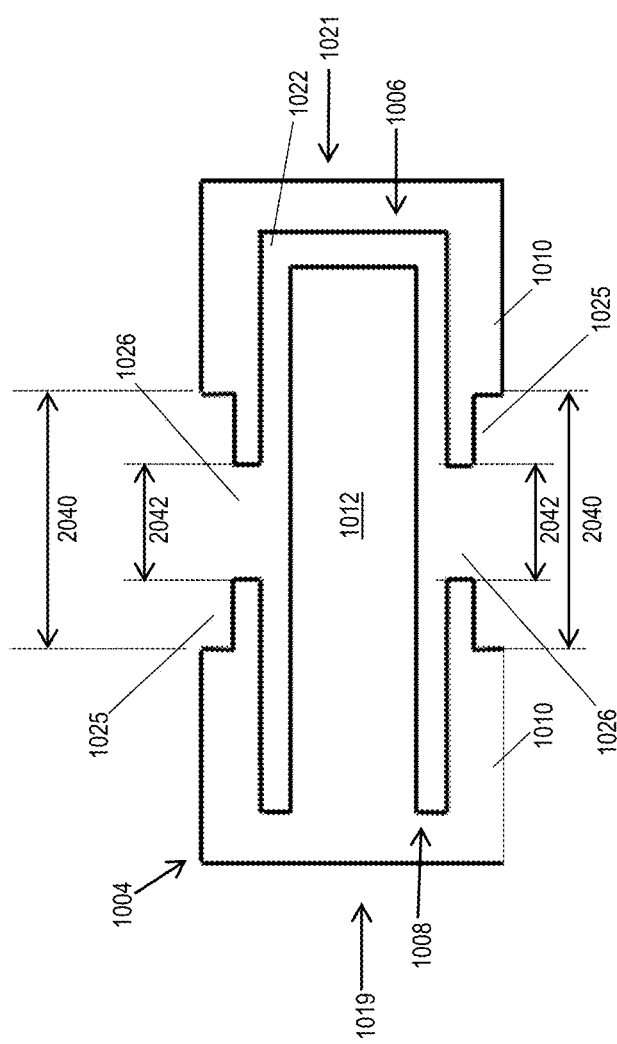
FIG. 10B illustrates a top down view of the embodiment of the active electrode layer of FIG. 10A in which multiple capacitive regions are formed according to aspects of the present disclosure.
Figure 10C:
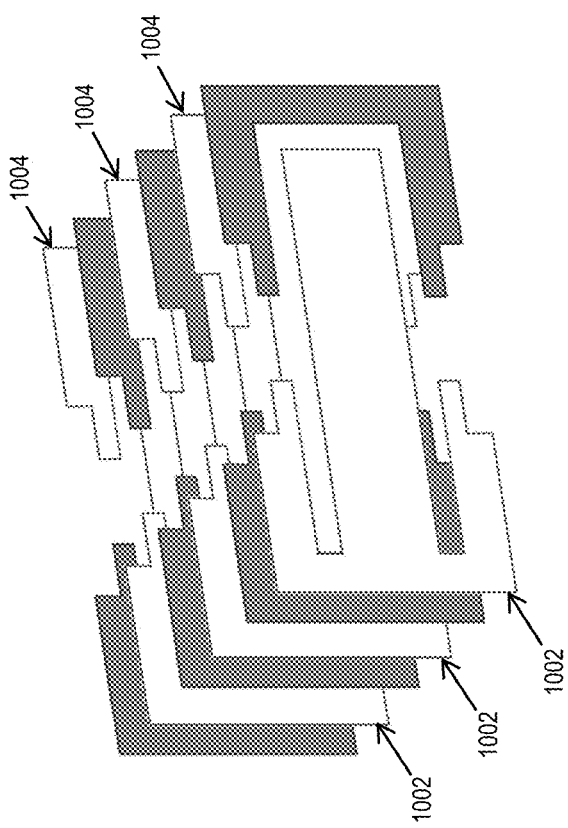
FIG. 10C illustrates a perspective view of alternating electrode layers configured as shown in FIG. 10A according to aspects of the present disclosure.

FIGS. 10A and 10B illustrate another embodiment of the first and second active electrode layers 1002, 1004. More specifically, each active electrode layer 1002, 1004 may include a first electrode 1006 and a second electrode 1008. The first electrode 1006 may have a base portion 1014. A pair of electrode arms 1010 and at least one central portion 1012 may extend from the base portion 1014. The second electrode 1008 may have a base portion 1014 that extends along a longitudinal edge of the second electrode layer 1008. The second electrode 1006 may have a pair of electrode arms 1010 extending from the base portion 1014. The electrode regions 812, 814, 816 may generally be non-overlapping.

Referring to FIG. 9E, in some embodiments, the broadband multilayer ceramic capacitor 1000 may have a capacitor thickness 856 in the Z-direction 1036 between the top surface 818 and the bottom surface 820.

The dielectric region 812 may have a dielectric region thickness 858 in the Z-direction 1036. In some embodiments, a ratio of the capacitor thickness 856 to the dielectric region thickness 858 may range from about 1.1 to about 20, in some embodiments from about 1.5 to about 10, in some embodiments from about 1.7 to about 5.

The active electrode region 814 may be an active electrode region thickness 59 in the Z-direction 1036. The active electrode region 814 may be free of shield electrodes 822, 824, and/or may include only overlapping electrodes. The active electrode region thickness 859 may be defined between the lowest active electrode layer 819 and a highest electrode layer 865. A ratio of the capacitor thickness 856 to the active electrode region thickness 859 may range from about 1.1 to about 20.

The shield electrode region 816 may have a shield electrode region thickness 861 in the Z-direction 1036. The shield electrode region thickness 861 may be defined between the bottom surface 820 of the capacitor 1000 and a lowest electrode layer 819 of the plurality of active electrodes. A ratio of the capacitor thickness 856 to the shield electrode region thickness 861 may range from about 1.1 to about 20, in some embodiments from about 1.5 to about 10, in some embodiments from about 1.7 to about 5.

In some embodiments, a shield-to-bottom-surface distance 863 may be defined as a distance between the shield electrodes 822, 824 and the bottom surface 820 of the capacitor 1000. If multiple shield electrode layers are included, the shield-to-bottom-surface distance 863 may be defined as the distance between the lowest of the shield electrode layers and the bottom surface 820. A ratio of the capacitor thickness 856 to the shield-to-bottom-surface distance 63 may range from about 1.1 to about 20, in some embodiments from about 1.5 to about 10, in some embodiments from about 1.7 to about 5.

In some embodiments, the shield electrodes 22, 24 may be spaced apart from the active electrodes 1006, 1008 by a first shield-to-active distance 67. A ratio of the first shield-to-active distance 67 to the shield-to-bottom-surface distance 63 may range from about 1 to about 20, in some embodiments from about 2 to about 10, and in some embodiments from about 3 to about 5.

In addition, FIG. 10A illustrates electrode arms 1010 that include a main portion 1028 and a step portion 1030. More specifically, an electrode arm 1010 of the first electrode 1006 may include a first longitudinal edge 860 that extends in the lateral direction 1034 and may define an edge of the step portion 1030. A second longitudinal edge 62 may extend in the lateral direction 1034 and may define an edge of the main portion 1028 of the arm 1010. The first longitudinal edge 860 may be offset from the second longitudinal edge 862 in the longitudinal direction 1032 by an arm offset distance 864. One or both electrode arms 1010 of the first electrode 1006 and/or second electrode 1008 may include respective main and step portions 1028, 1030. For example, both arms 1010 of both electrodes 1006, 1008 may include respective main portions 1028 and step portions 1030, for example as illustrated in FIG. 10A. Main arm gaps 2040 may be formed between the step portions 1030 of aligned arms 1010. Step arm gaps 2042 may be formed between the main portions 1028 of aligned arms 1010.

The following table provides experimentally determined insertion loss values for the capacitor 1000 of FIG. 9E:

| Test Frequency (GHz) | Insertion Loss (dB) |
|---|---|
| 10 | −0.20 |
| 15 | −0.25 |
| 20 | −0.28 |
| 25 | −0.26 |
| 30 | −0.22 |
| 35 | −0.20 |
| 40 | −0.10 |

Referring to FIG. 9C, several capacitive regions may be formed between the first electrode 1006 and the second electrode 1008 of the electrode configuration of FIG. 9A.

For example, in some embodiments, a central capacitive region 1022 may be formed between the central portion 1012 of the first electrode 1006 and the base portion 1014 and/or arms 1010 of the second electrode 1008. In some embodiments, a main arm gap capacitive region 1025 may be formed within the main arm gap 2040, and a step gap capacitive region 1026 may be formed within the step arm gap 2042.

Figure 11A:
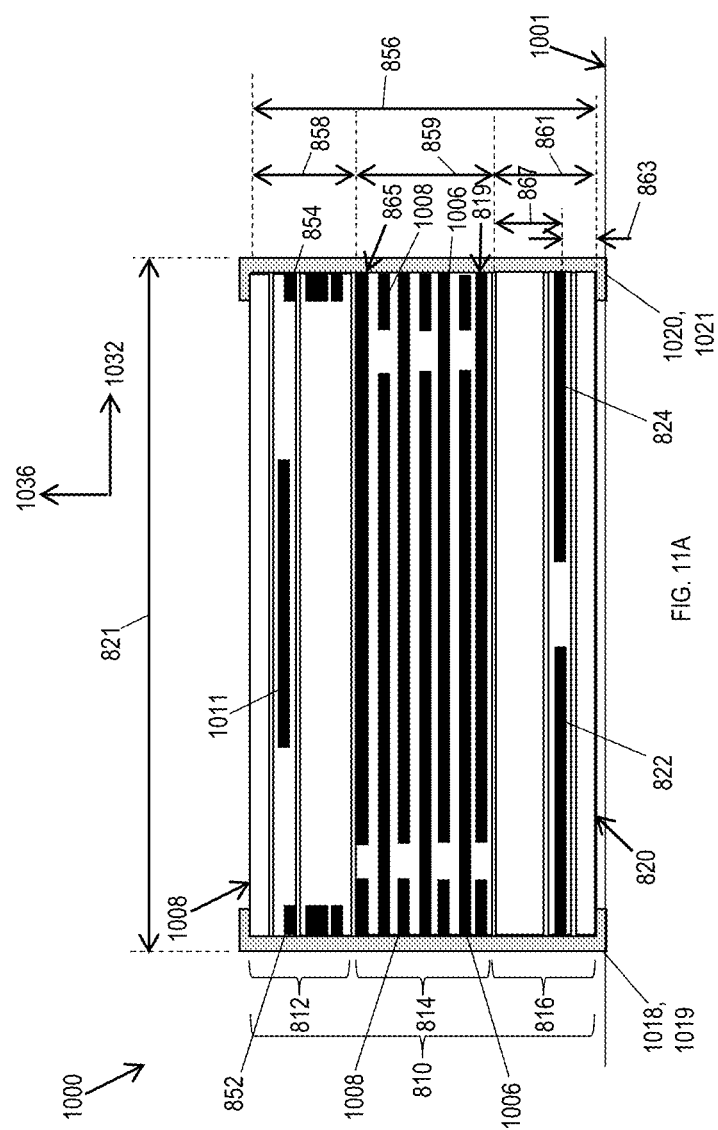
FIG. 11A a side cross sectional view of another embodiment of a capacitor including multiple regions in which active electrode layers are configured as shown in FIGS. 10A through 10C and a shield electrode layer is configured as shown in FIG. 9D according to aspects of the present disclosure.

Referring to FIG. 11A, in some embodiments, the dielectric region 812 may include first dummy tab electrodes 852 connected with the first terminal 1018 and/or second dummy tab electrodes 854 connected with the second terminal 1020. More specifically, the dummy tab electrodes 852, 854 may be used to from (e.g., deposit) the terminals 1018, 1020, for example using a fine copper termination process. The dummy tab electrodes 852, 854 may extend less than 25% of the capacitor length 821 from the first end 1019 or the second end 1021.

The electrode configurations described herein may allow for a primary capacitive element between central portions 1012 of adjacent active electrode layers 1002, 1004 (i.e., parallel plate capacitance), as well as additional secondary capacitive elements, for example as described above with reference to FIGS. 9C, 9D, and 10B.

In some embodiments, the capacitor 1000 may include one or more floating electrodes 1011. The floating electrode 1011 may be positioned in the dielectric region 12. However, in other embodiments, the floating electrode 1011 may be positioned in the active electrode region 814 and/or shield electrode region 816. In general, such floating electrodes 1011 are not directly connected to an external terminal 1018, 1020.

However, in some embodiments, the floating electrode may be a part of a floating electrode layer containing at least one electrode that is electrically connected to an external terminal; however, such floating electrode layer contains at least one floating electrode that does not directly contact such electrode or external terminal.

The floating electrode may be positioned and configured according to any method known in the art. For instance, the floating electrode may be provided such that it overlaps at least a portion, such as a central portion, of a first active electrode and/or a second active electrode of an active electrode layer. In this regard, the floating electrode layer may be layered and disposed alternately with the first electrode layers and the second internal electrode layers; in this regard, such layers may be separated by the dielectric layers.

In addition, such floating electrodes may have any shape as generally known in the art. For instance, in one embodiment, the floating electrode layers may include at least one floating electrode having a dagger like configuration. For instance, such configuration may be similar to the configuration and shape of the first electrode as described herein. However, it should be understood that such first electrode may or may not contain an electrode arm with a step portion.

In addition, in one embodiment, the floating electrode layer may contain at least one floating electrode wherein the end of the floating electrode is adjacent at least one external terminal but does not contact such external terminal. In this regard, such gap may be referred to as a floating electrode gap in a longitudinal direction. Such floating electrode gap may be greater than 0%, such as about 3% or more, such as about 5% or more to about 50% or less, such as about 40% or less, such as about 30% or less, such as about 20% or less, such as about 10% or less the length of the capacitor in the longitudinal direction.

FIG. 11B illustrates another embodiment of a broadband multilayer ceramic capacitor 1060 according to aspects of the present disclosure. The capacitor 1060 may include a plurality of electrode regions 1062. The plurality of electrode regions 1062 may include an active electrode region 814, a first shield electrode region 1064 and a second shield electrode region 1066. The active electrode region 814 may be located between the first shield electrode region 1064 and the second shield electrode region 1066.

In some embodiments, the capacitor 1060, or a portion thereof, may be symmetric about a longitudinal centerline 1067 that extends in the longitudinal direction. For example, the shield electrodes 822, 824 of the bottom or first shield electrode region 1064 may be symmetric about the longitudinal centerline 1067 with respect the shield electrodes 822, 824 of the top or second shield electrode region 1066. In other words, the shield-to-bottom-surface distance 863 may be approximately equal to a shield-to-top-surface distance 1068, which may be defined between the shield electrodes 822, 824 of the second shield electrode region 1066 and the top surface 818 of the capacitor 1060. For example, in some embodiments, a ratio of the shield-to-bottom-surface distance 863 to the shield-to-top-surface distance 1068 may range from about 0.8 to about 1.2, in some embodiments from about 0.9 to about 1.1, in some embodiments from about 0.95 to about 1.05, and in some embodiments from about 0.98 to about 1.02.

The shield electrodes 822, 824 of the top shield electrode region 1066 may be spaced apart from the active electrodes 1006, 1008 by a second shield-to-active distance 1069. A ratio of the second shield-to-active distance 1069 to the shield-to-top-surface distance 1068 may range from about 1 to about 20, in some embodiments from about 2 to about 10, and in some embodiments from about 3 to about 5. Additionally, a ratio of the first shield-to-active distance 67 to the second shield-to-active distance 1069 may range from about 0.8 to about 1.2, in some embodiments from about 0.9 to about 1.1, in some embodiments from about 0.95 to about 1.05, and in some embodiments from about 0.98 to about 1.02.

FIG. 12 schematically illustrates three capacitive elements of the electrode configuration of FIG. 9C: a primary capacitive element 1012' between adjacent electrode layers, a central capacitive element 1022', and an arm gap capacitive element 1024'. The capacitive elements 1012', 1022' and 1024' correspond with the central portion 1012, central capacitive region 1022, and arm gap capacitive region 1024, respectively, of FIG. 9C. In addition, external terminals are depicted as 1018 and 1020 in FIG. 12.

FIG. 13 schematically illustrates four capacitive elements of the electrode configuration of FIG. 10B, in which capacitive elements 1012', 1022' and 1025', and 1026' correspond with the central portion 1012, capacitive region 1022, main arm gap capacitive region 1025, and step gap capacitive region 1026, respectively, of FIG. 10B. It should be understood that the dimensions of the various gaps may be selectively designed to achieve desired respective capacitance values for the capacitive elements illustrated in FIG. 13. More specifically, the configuration of the capacitor and various parameters such as the number of electrode layers, the surface area of the overlapping central portions of electrode pairs, the distance separating electrodes, the dielectric constant of the dielectric material, etc., may be selected to achieve desired capacitance values. Nevertheless, the capacitor as disclosed herein may include an array of combined series and parallel capacitors to provide effective broadband performance.

In one exemplary ultra-broadband capacitor embodiment, primary capacitive element 1012' generally corresponds to a relatively large capacitance adapted for operation at a generally lower frequency range, such as on the order of between about several kilohertz (kHz) to about 200 megahertz (MHz), while secondary capacitive elements 1022', 1024', 1025' and/or 1026' may generally correspond to relatively smaller value capacitors configured to operate at a relatively higher frequency range, such as on the order of between about 200 megahertz (MHz) to many gigahertz (GHz).

Thus, the active electrodes may be configured to exhibit a plurality of capacitive elements within a single set of stacked electrodes. For instance, a primary capacitive element may be effective at relatively low frequencies while a secondary capacitive elements (e.g., the central capacitive region 1022 and/or arm gap capacitive region 1024) may be effective at relatively medium and/or high frequencies. For instance, the primary capacitance may be within 1 and 500 nF, such as within about 10 and 100 nF while the secondary capacitance may be within 1 and 500 pF, such as within 10 and 100 pF.

Figure 14B:
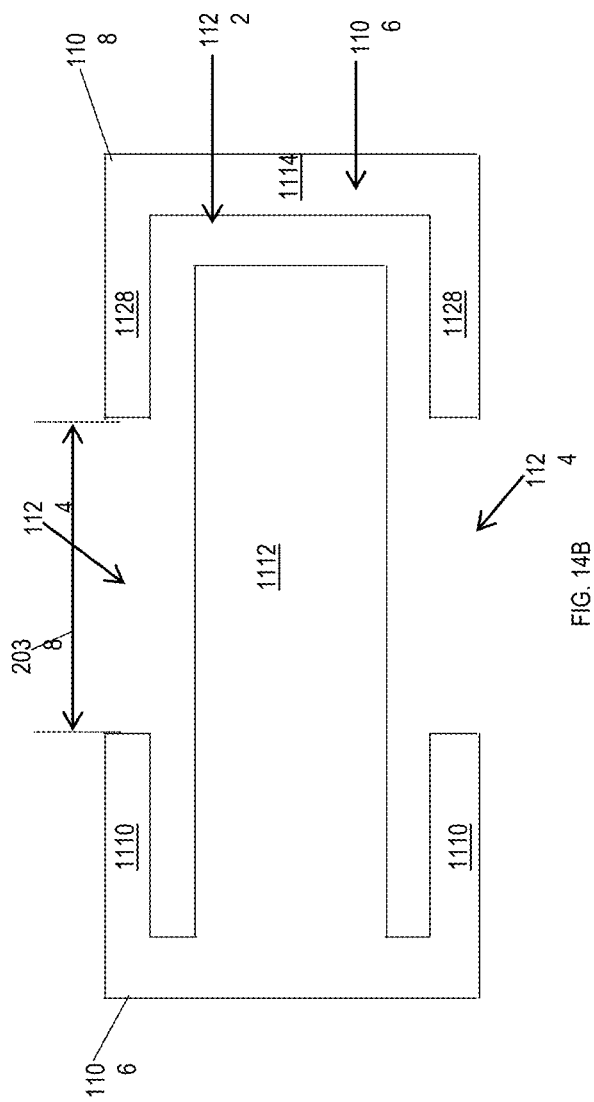
FIG. 14B illustrates multiple capacitive regions of the electrode pattern of FIG. 14A according to aspects of the present disclosure.
Figure 14C:
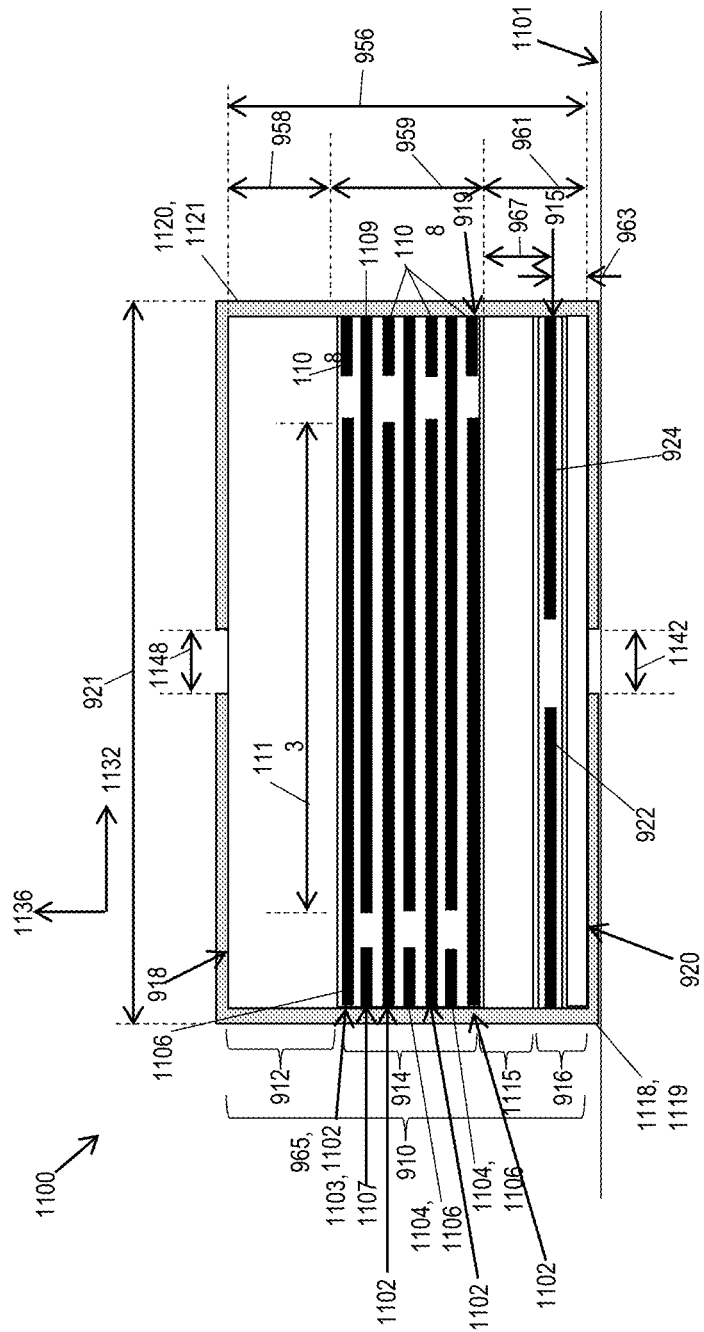
FIG. 14C illustrates a side elevation view of an embodiment of a capacitor including shield electrodes according to aspects of the present disclosure.
Figure 14D:
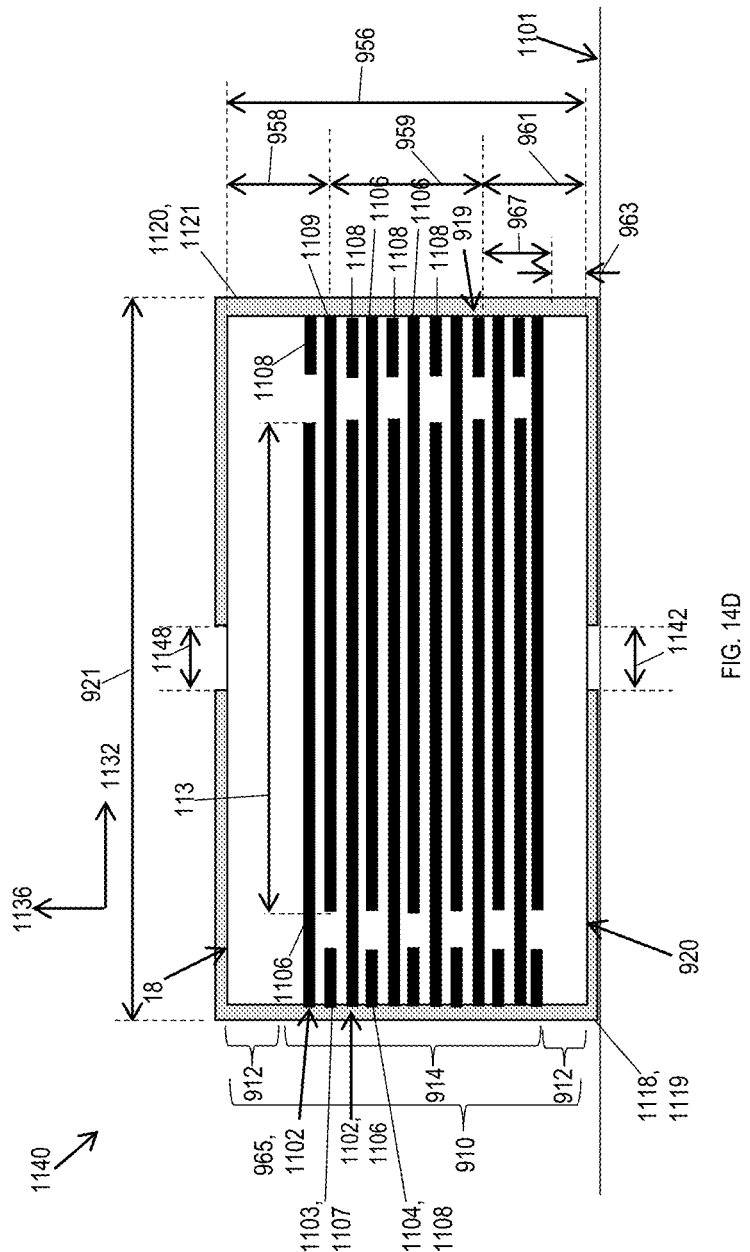
FIG. 14D illustrates a side elevation view of another capacitor without shield electrodes according to aspects of the present disclosure.

Turning to FIGS. 14A-14O, another embodiment of a broadband multilayer ceramic capacitor 1100 is disclosed. FIG. 14A illustrates a top view of one embodiment of an example active electrode layer 1102 of the capacitor 1100 according to aspects of the present disclosure. FIG. 14B illustrates multiple capacitive regions formed by the electrode layers 1102 and shield electrode layers 915. FIG. 14C illustrates a simplified side elevation view of one embodiment of the capacitor 1100 of FIG. 14A according to aspects of the present disclosure. FIG. 14D is a simplified side elevation view of another embodiment of a capacitor 1140. Referring to FIG. 14C, the capacitor 1100 may include a plurality of electrode regions 910 that are stacked in the Z-direction 1136. The plurality of electrode regions 910 may include a dielectric region 912, an active electrode region 914, a shield electrode region 916, and an additional dielectric region 1115. The active electrode region 914 may be located between the dielectric region 912 and the shield electrode region 916 in the Z-direction 1136. The dielectric region 912 may extend from the active electrode region 914 to a top surface 918 of the broadband multilayer ceramic capacitor 1100. The capacitor 1100 may include a bottom surface 920 opposite the top surface 918 in the Z-direction 1136.

FIG. 14A illustrates a top view of one embodiment of an active electrode pattern for one or more electrodes in the active electrode region 914 according to aspects of the present disclosure. More specifically, the active electrode region 914 may include first electrode layers 1102 and second electrode layers 1104 in an alternating arrangement, for example as described below with reference to FIG. 14B. Referring to FIG. 14A, each electrode layer 1102, 1104 may include a first active electrode 1106 and a second active electrode 1108. The first active electrode 1106 may have a base portion 1114 that extends along a longitudinal edge of the first active electrode 1106 in the lateral direction 1134. The first active electrode 1106 may have a pair of electrode arms 1110 extending from a base portion 1114 in the longitudinal direction 1132. The second active electrode 1108 may have a base portion 1114 that extends along a longitudinal edge of the second electrode layer 1108 in the lateral direction 1134. The second active electrode 1108 may have a pair of electrode arms 1110 extending from the base portion 1114 in the longitudinal direction 1132.

The electrode arm(s) 1110 of the first active electrode 1106 may be generally longitudinally aligned with respect to the electrode arm(s) 1110 of the second active electrode 1108. Arm gap(s) 2026 may be defined in the longitudinal direction 1132 between aligned electrode arms 1110 of the first and second electrodes 1106, 1108.

Referring to FIG. 14B, several capacitive regions may be formed between the first active electrode 1106 and the second active electrode 1108. For example, in some embodiments, a central capacitive region 1122 may be formed between the central portion 1112 of the first active electrode 1106 and the base portion 1114 and/or arms 1128 of the second active electrode 1108. In some embodiments, an arm gap capacitive region 1124 may be formed within an arm gap 2138 between the electrode arms 1110 of the first active electrode 1106 and the second active electrode 1108.

Referring to FIGS. 14C and 14D, a plurality of first electrode layers 1102 and a plurality of second electrode layers 1104 may be arranged in an alternating, mirrored configuration. As illustrated, the central portions 1112 of the respective electrode layers at least partially overlap. FIG. 14C illustrates a total of four electrode layers; however, it should be understood that any number of electrode layers may be employed to obtain the desired capacitance for the desired application.

The plurality of active electrode layers 1102, 1104 may be arranged within the active electrode region 914. Each active electrode layer 1102, 1104 may include one or more active electrodes, for example as described below with reference to FIGS. 14A through 14C. For example, a first active electrode layer 1102 can include a first active electrode 1106 and a second active electrode 1108. A second active electrode layer 1103 can include a third active electrode 1107 connected with the first external terminal 1118 and a fourth active electrode 1109 connected with the second external terminal 1120. The third active electrode 1107 can be co-planar with the fourth active electrode 1109. The first active electrode 1106 can overlap the fourth active electrode 1109 in the longitudinal direction 1132. The first active electrode 1106 can overlap the fourth active electrode along an overlap distance 1113. The capacitor 1100 may contain alternating first active electrode layers 1102 and second active electrode layers 1103, 1104.

The capacitor 1100 may include one or more shield electrode layers 915 in the shield electrode region 916. The shield electrode layers 915 may have a variety of configurations, for example as described above with reference to FIG. 9D. The shield electrode region 916 may be located within the capacitor 1100 between the active electrode region 914 and the bottom surface 920 of the capacitor 1100. The shield electrode layers 915 are generally spaced apart from the active electrode layers 1102, 1104 by a shield-to-active distance 967 such that the shield electrodes 922, 924 are distinguished from the active electrodes 1106, 1108. For example, the active electrode layers 1102, 1104 may be uniformly spaced apart from each other in the Z-direction 1136 by an active electrode spacing distance 1105, which is sometimes referred to as "drop." The shield-to-active distance 967 may be greater than the active electrode spacing distance 1105. For instance, the shield-to-active distance 967 may be two times or more greater than the active electrode spacing distance 1105. As examples, the active electrode spacing distance 1105 may range from about 0.5 microns to about 5 microns. The shield-to-active distance 967 may be greater than about 5 microns, in some embodiments greater than about 10 microns, in some embodiments greater than about 20 microns, and in some embodiments greater than about 30 microns.

In some embodiments, capacitor 1100 may be free of electrode layers 1102, 1104 in an additional dielectric region 1115 (e.g., a second dielectric region) between the active electrode region 914 and the shield electrode region 916 in the Z-direction 1136. However, in other embodiments, the region 1115 between the active electrode region 914 and the shield electrode region 916 may include one or dummy electrode tabs, for example as shown in FIG. 11A, which may aid in forming the external terminals.

In some embodiments, the broadband multilayer ceramic capacitor 1100 may have a capacitor thickness 956 in the Z-direction 1136 between the top surface 918 and the bottom surface 920. The dielectric region 912 may have a dielectric region thickness 958 in the Z-direction 1136. In some embodiments, a ratio of the capacitor thickness 956 to the dielectric region thickness 958 may be less than about 10.

The active electrode region 914 may be an active electrode region thickness 959 in the Z-direction 1136. The active electrode region 914 may be free of shield electrodes 922, 924, and/or may include only overlapping electrodes. The active electrode region thickness 959 may be defined between the lowest active electrode layer 919 and a highest active electrode layer 965. A ratio of the capacitor thickness 956 to the active electrode region thickness 959 may range from about 1.1 to about 20.

The shield electrode region 916 may have a shield electrode region thickness 961 in the Z-direction 1136. The shield electrode region thickness 961 may be defined between a lowest shield electrode 1137 of the shield electrode region 916 and a highest shield electrode 1138 of the shield electrode region 16 with respect to the Z-direction 1136. A ratio of the capacitor thickness 956 to the shield electrode region thickness 961 may range from about 1.1 to about 20.

In some embodiments, a shield-to-bottom-surface distance 963 may be defined as a distance between the shield electrodes 922, 924 and the bottom surface 920 of the capacitor 1100. If multiple shield electrode layers 915 are included, the shield-to-bottom-surface distance 963 may be defined as the distance between the lowest of the shield electrode layers 915 and the bottom surface 920. A ratio of the capacitor thickness 956 to the shield-to-bottom-surface distance 963 may be greater than about 2.

In some embodiments, the shield electrodes 922, 924 may be spaced apart from the active electrodes 1106, 1108 by a first shield-to-active distance 967. The first shield-to-active distance 967 may be defined between the lowest active electrode 919 and the top shield electrode 1138 closest to the lowest active electrode 919 in the Z-direction 1136. A ratio of the first shield-to-active distance 967 to the shield-to-bottom-surface distance 963 may range from about 1 to about 20, in some embodiments from about 2 to about 10, and in some embodiments from about 3 to about 5.

In general, regarding embodiments discussed herein, the external terminals 1118, 1120 may be formed from any of a variety of different metals as is known in the art. External terminals 1118, 1120 may be formed from any of a variety of different metals as is known in the art. The external terminals 1118, 1120 may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals 1118, 1120 may comprise copper or an alloy thereof.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A surface mount component comprising:
a monolithic substrate;
an input terminal, an output terminal, and a DC bias terminal, each formed over the monolithic substrate;
a conductive trace formed over a surface of the monolithic substrate included in a signal path between the input terminal and the output terminal; and
a thin-film resistor connected in a DC bias path between the DC bias terminal and the signal path;
wherein the DC bias path, at one or more locations along the DC bias path between the DC bias terminal and the signal path, has a cross-sectional area in a plane that is perpendicular to the surface of the monolithic substrate, and wherein the cross-sectional area of the DC bias path is less than about 1,000 square microns, and
wherein the thin-film resistor is directly electrically connected with each of the DC bias terminal and the output terminal.

2. The surface mount component of claim 1, wherein the DC bias path comprises a first conductive thin-film connector connected between the thin-film resistor and the signal path, and wherein the first conductive thin-film connector has the cross-sectional area that is less than about 1,000 square microns.

3. The surface mount component of claim 1, further comprising an additional DC bias terminal and an additional DC bias path, and wherein the additional DC bias path comprises an additional thin-film resistor connected between the signal path and the additional DC bias terminal.

4. The surface mount component of claim 3, wherein the additional DC bias path comprises a second conductive thin-film connector connected between the additional thin-film resistor and the signal path, and wherein the second conductive thin-film connector has an additional cross-sectional area in a plane perpendicular to the surface of the monolithic substrate, the additional cross-sectional area being less than about 1,000 square microns.

5. The surface mount component of claim 3, wherein the second conductive thin-film connector is connected between the additional thin-film resistor and the output terminal.

6. The surface mount component of claim 4, wherein a ratio of the cross-sectional area to the additional cross-sectional area ranges from about 0.9 to about 1.1.

7. The surface mount component of claim 4, wherein the second conductive thin-film connector is connected between the additional thin-film resistor and the conductive trace, wherein the conductive trace is elongated in a Y-direction and has opposing straight edges extending in the Y-direction, and wherein the second conductive thin-film connector has the cross-sectional area that is less than about 1,000 square microns where the second conductive thin-film connector connects with one of the opposing straight edges of the conductive trace.

8. The surface mount component of claim 1, wherein the conductive trace is directly electrically connected with each of the input terminal and the output terminal.

9. The surface mount component of claim 1, further comprising a capacitor connected with the conductive trace in the signal path between the input terminal and the output terminal.

10. The surface mount component of claim 9, wherein the capacitor comprises a multilayer ceramic capacitor.

11. The surface mount component of claim 10, wherein the capacitor exhibits an insertion loss that is greater than about −0.5 dB from about 5 GHz to about 20 GHz.

12. The surface mount component of claim 10, wherein the capacitor comprises:
a first external terminal disposed along a first end of the capacitor, the first external terminal including a bottom portion that extends along a bottom surface of the capacitor; and
a second external terminal disposed along a second end of the capacitor that is opposite the first end in a longitudinal direction, the second external terminal including a bottom portion that extends along the bottom surface of the capacitor, the bottom portion of the first external terminal and the bottom portion of the second external terminal being spaced apart in the longitudinal direction by a bottom external terminal spacing distance;
wherein the capacitor has a capacitor length in the longitudinal direction between the first end and the second end, and a ratio of the capacitor length to the bottom external terminal spacing distance is greater than about 4.

13. The surface mount component of claim 2, wherein the first conductive thin-film connector has a pair of substantially straight edges that converge at a first location.

14. The surface mount component of claim 1, wherein at least one of the input terminal, the output terminal, or the DC bias terminal is formed over the surface of the monolithic substrate and spaced apart from an edge of the monolithic substrate for grid array type mounting of the surface mount component.

15. The surface mount component of claim 1, wherein at least one of the input terminal, the output terminal, or the DC bias terminal is formed along a side surface of the monolithic substrate that is perpendicular to the surface of the monolithic substrate.

16. The surface mount component of claim 1, wherein the thin-film resistor comprises at least one of chrome silicon or silicon chromium.

17. The surface mount component of claim 1, wherein the thin-film resistor comprises a layer of resistive material having a thickness of less than about 10 microns.

18. The surface mount component of claim 1, wherein the cross-sectional area has a width in an XY plane, the width of the cross-sectional area being less than about 100 microns.

19. The surface mount component of claim 1, wherein the thin-film resistor has a generally serpentine shape.

20. A surface mount component comprising:
a monolithic substrate;
an input terminal, an output terminal, and a DC bias terminal, each formed over the monolithic substrate;
a conductive trace formed over a surface of the monolithic substrate included in a signal path between the input terminal and the output terminal; and
a thin-film resistor connected in a DC bias path between the DC bias terminal and the signal path;
wherein the DC bias path has, at one or more locations along the DC bias path between the DC bias terminal and the signal path, a width in an XY plane that is parallel with the surface of the monolithic substrate, the width being less than about 100 microns, and
wherein the thin-film resistor is directly electrically connected with each of the DC bias terminal and the output terminal.

21. The surface mount component of claim 20, wherein the DC bias path comprises a first conductive thin-film connector connected between the thin-film resistor and the signal path, and wherein the first conductive thin-film connector has the width that is less than about 100 microns.

22. The surface mount component of claim 20, further comprising an additional DC bias terminal and an additional DC bias path, and wherein the additional DC bias path comprises an additional thin-film resistor connected between the signal path and the additional DC bias terminal.

23. The surface mount component of claim 22, wherein the DC bias path comprises a first conductive thin-film connector connected between the thin-film resistor and the signal path, wherein the first conductive thin-film connector has the width that is less than about 100 microns, wherein the additional DC bias path comprises a second conductive thin-film connector connected between the additional thin-film resistor and the signal path, and wherein the second conductive thin-film connector has an additional width in a plane perpendicular to the surface of the monolithic substrate, the additional width being less than about 100 microns.

24. The surface mount component of claim 23, wherein the second conductive thin-film connector is connected between the additional thin-film resistor and the output terminal.

25. The surface mount component of claim 23, wherein a ratio of the width of the first conductive thin-film connector to the additional width of the second conductive thin-film connector ranges from about 0.9 to about 1.1.

26. The surface mount component of claim 23, wherein the second conductive thin-film connector is connected between the additional thin-film resistor and the conductive trace, wherein the conductive trace is elongated in a Y-direction and has opposing straight edges extending in the Y-direction, and wherein the second conductive thin-film connector has the width that is less than about 100 microns where the second conductive thin-film connector connects with one of the opposing straight edges of the conductive trace.

27. The surface mount component of claim 20, wherein the conductive trace is directly electrically connected with each of the input terminal and the output terminal.

28. The surface mount component of claim 20, further comprising a capacitor connected with the conductive trace in the signal path between the input terminal and the output terminal.

29. The surface mount component of claim 21, wherein the first conductive thin-film connector has a pair of substantially straight edges that converge at a first location.

30. The surface mount component of claim 20, wherein at least one of the input terminal, the output terminal, or the DC bias terminal is formed over the surface of the monolithic substrate and spaced apart from an edge of the monolithic substrate for grid array type mounting of the surface mount component.

31. The surface mount component of claim 20, wherein at least one of the input terminal, the output terminal, or the DC bias terminal is formed along a side surface of the monolithic substrate that is perpendicular to the surface of the monolithic substrate.

32. The surface mount component of claim 20, wherein the thin-film resistor comprises at least one of chrome silicon or silicon chromium.

33. The surface mount component of claim 20, wherein the thin-film resistor comprises a layer of resistive material having a thickness of less than about 10 microns.

34. A method of forming a surface mount component, the method comprising:
  patterning a conductive trace over a surface of a monolithic substrate included in a signal path;
  depositing a thin-film resistor; and
  forming the input terminal, the output terminal, and the DC bias terminal over the monolithic substrate;
  wherein the conductive trace is included in the signal path between the input terminal and the output terminal; and
  wherein the thin-film resistor is connected in a DC bias path between a DC bias terminal and the signal path,
  wherein the DC bias path, at one or more locations along the DC bias path between the DC bias terminal and the signal path, has a cross-sectional area in a plane that is perpendicular to the surface of the monolithic substrate, and the cross-sectional area of the DC bias path is less than about 1,000 square microns, and
  wherein the thin-film resistor is directly electrically connected with each of the DC bias terminal and the output terminal.

* * * * *